(12) United States Patent
Pereira et al.

(10) Patent No.: US 6,801,981 B1
(45) Date of Patent: Oct. 5, 2004

(54) INTRA-ROW CONFIGURABILITY OF CONTENT ADDRESSABLE MEMORY

(75) Inventors: Jose Pio Pereira, Santa Clara, CA (US); Varadaraian Srinivasan, Los Altos Hills, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 644 days.

(21) Appl. No.: 09/594,206

(22) Filed: Jun. 14, 2000

(51) Int. Cl.[7] .............................................. G06F 12/00
(52) U.S. Cl. ........................ 711/108; 711/212; 365/49; 365/203
(58) Field of Search ................................ 711/108, 100, 711/103, 4, 214, 216, 212; 365/49, 203, 230.03, 189.07

(56) References Cited

U.S. PATENT DOCUMENTS

| | | | |
|---|---|---|---|
| 4,159,538 A | | 6/1979 | Motsch |
| 5,325,501 A | | 6/1994 | Carlstedt |
| 5,444,649 A | | 8/1995 | Nemirovsky |
| 5,576,985 A | | 11/1996 | Holtz |
| 5,613,136 A | | 3/1997 | Casavant et al. |
| 5,706,224 A | * | 1/1998 | Srinivasan et al. ............ 365/49 |
| 5,717,901 A | * | 2/1998 | Sung et al. .................. 711/170 |
| 5,943,252 A | * | 8/1999 | Schultz et al. ................. 365/49 |
| 5,999,435 A | | 12/1999 | Henderson et al. |
| 6,098,147 A | | 8/2000 | Mizuhara |
| 6,122,702 A | * | 9/2000 | Pelagalli et al. ................ 711/1 |
| 6,125,049 A | | 9/2000 | Nataraj |
| 6,137,707 A | | 10/2000 | Srinivasan et al. |
| 6,147,891 A | | 11/2000 | Nataraj |
| 6,148,364 A | | 11/2000 | Srinivasan et al. |
| 6,154,384 A | | 11/2000 | Nataraj et al. |

(List continued on next page.)

FOREIGN PATENT DOCUMENTS

| EP | 0858077 A2 | 8/1998 |
|---|---|---|
| WO | WO99/23663 A1 | 5/1999 |

OTHER PUBLICATIONS

PCT International Search Report for PCT Int'l Appln No. US01/40954, mailed Feb. 6, 2002 (7 pages).

*Primary Examiner*—Pierre Bataille
(74) *Attorney, Agent, or Firm*—Blakely, Sokoloff, Taylor & Zafman, LLP

(57) ABSTRACT

A CAM system having intra-row configurability. For one embodiment, the CAM system includes a CAM array having a number of rows of CAM cells each segmented into row segments. Each row segment includes a number of CAM cells coupled to a corresponding match line segment. Individual row segments or groups of row segments are uniquely addressable by address logic in response to configuration information that indicates a width and depth configuration of the CAM array. The configuration information may be stored in a configuration register. Data may be communicated with an addressed row segment or group of row segments using data access circuitry. Priority encoding circuitry may be included to generate the address of a row segment or group of row segments that stores data matching comparand data in response to the configuration information. Match flag logic may also be included to determine when comparand data matches data stored in one of the row segments or one of the groups of row segments in response to the configuration information. Additionally, multiple match flag logic may be included to determine when comparand data matches data stored in each of a plurality of row segments and to determine when comparand data matches data stored in each of a plurality of groups of row segments in response to the configuration information.

22 Claims, 33 Drawing Sheets

U.S. PATENT DOCUMENTS

| | | | |
|---|---|---|---|
| 6,166,938 A | 12/2000 | Wong | |
| 6,166,939 A | 12/2000 | Nataraj et al. | |
| 6,175,513 B1 | 1/2001 | Khanna | |
| 6,175,514 B1 | 1/2001 | Henderson et al. | |
| 6,191,969 B1 | 2/2001 | Pereira | |
| 6,191,970 B1 | 2/2001 | Pereira | |
| 6,199,140 B1 | 3/2001 | Srinivasan et al. | |
| 6,219,748 B1 | 4/2001 | Srinivasan et al. | |
| 6,229,742 B1 | 5/2001 | Srinivasan et al. | |
| 6,237,061 B1 | 5/2001 | Srinivasan et al. | |
| 6,240,000 B1 * | 5/2001 | Sywyk et al. | 365/49 |
| 6,240,485 B1 | 5/2001 | Srinivasan et al. | |
| 6,243,280 B1 | 6/2001 | Wong et al. | |
| 6,243,281 B1 | 6/2001 | Pereira | |
| 6,249,467 B1 | 6/2001 | Pereira et al. | |
| 6,275,426 B1 | 8/2001 | Srinivasan et al. | |
| 6,310,880 B1 * | 10/2001 | Waller | 365/49 |
| 6,317,350 B1 | 11/2001 | Pereira et al. | |
| 6,324,087 B1 | 11/2001 | Pereira | |
| 6,370,613 B1 * | 4/2002 | Diede et al. | 711/108 |
| 6,374,326 B1 | 4/2002 | Kansal et al. | |
| 6,381,673 B1 | 4/2002 | Srinivasan et al. | |
| 6,393,514 B1 | 5/2002 | Khanna et al. | |
| 6,418,042 B1 | 7/2002 | Srinivasan et al. | |
| 6,430,074 B1 | 8/2002 | Srinivasan | |
| 6,438,674 B1 | 8/2002 | Perloff | |
| 6,445,628 B1 | 9/2002 | Pereira et al. | |
| 6,460,112 B1 | 10/2002 | Srinivasan et al. | |
| 6,493,793 B1 | 12/2002 | Pereira et al. | |
| 6,499,081 B1 | 12/2002 | Nataraj et al. | |
| 6,539,455 B1 | 3/2003 | Khanna et al. | |
| 6,542,391 B2 | 4/2003 | Pereira et al. | |
| 6,564,289 B2 | 5/2003 | Srinivasan et al. | |
| 6,567,340 B1 | 5/2003 | Nataraj et al. | |
| 6,574,702 B2 | 6/2003 | Khanna et al. | |
| 6,591,331 B1 | 7/2003 | Khanna | |
| 6,678,786 B2 | 1/2004 | Srinivasan et al. | |
| 6,687,785 B1 | 2/2004 | Pereira | |
| 6,697,911 B2 | 2/2004 | Srinivasan et al. | |
| 6,711,049 B1 | 3/2004 | Hsu et al. | |
| 2002/0129198 A1 | 9/2002 | Nataraj et al. | |
| 2002/0161969 A1 | 10/2002 | Nataraj et al. | |

* cited by examiner

| Config | Config Signal | ADDR | RA | SA | SDA |
|---|---|---|---|---|---|
| 4K x 72 | SZ1 | A11-A0 | A11-AZ | A1-A0 | A1-A0 |
| 2F x 144 | SZG1 | A10-A0 | A10-A1 | A0 | A0, SSEL0 |
| 1K x 288 | SZGZ | A9-A0 | A9-A0 | - | SSEL1-SSEL0 |

FIG. 4

| Config | A1 | A0 | SSEL1 | SSEL0 | SGW4 | SGW3 | SGW2 | SGW1 |
|---|---|---|---|---|---|---|---|---|
| 4K x 72 | 0 | 0 | x | x | 0 | 0 | 0 | 1 |
| 4K x 72 | 0 | 1 | x | x | 0 | 0 | 1 | 0 |
| 4K x 72 | 1 | 0 | x | x | 0 | 1 | 0 | 0 |
| 4K x 72 | 1 | 1 | x | x | 1 | 0 | 0 | 0 |
| 2K x 144 | x | 0 | x | 0 | 0 | 0 | 0 | 1 |
| 2K x 144 | x | 0 | x | 1 | 0 | 0 | 1 | 0 |
| 2K x 144 | x | 1 | x | 0 | 0 | 1 | 0 | 0 |
| 2K x 144 | x | 1 | x | 1 | 1 | 0 | 0 | 0 |
| 1K x 288 | x | x | 0 | 0 | 0 | 0 | 0 | 1 |
| 1K x 288 | x | x | 0 | 1 | 0 | 0 | 1 | 0 |
| 1K x 288 | x | x | 1 | 0 | 0 | 1 | 0 | 0 |
| 1K x 288 | x | x | 1 | 1 | 1 | 0 | 0 | 0 |

FIG. 5

| Config | CSSEL1 | CSSEL0 | CGW1 | CGW2 | CGW3 | CGW4 |
|---|---|---|---|---|---|---|
| 4k x 72 | x | x | 1 | 1 | 1 | 1 |
| 2k x 144 | x | 0 | 1 | 0 | 1 | 0 |
| 2k x 144 | x | 1 | 0 | 1 | 0 | 1 |
| 1k x 288 | 0 | 0 | 1 | 0 | 0 | 0 |
| 1k x 288 | 0 | 1 | 0 | 1 | 0 | 0 |
| 1k x 288 | 1 | 0 | 0 | 0 | 1 | 0 |
| 1k x 288 | 1 | 1 | 0 | 0 | 0 | 1 |

| M1 | M2 | M3 | M4 | ADDR | PSA0(1) | PSA0(0) |
|----|----|----|----|------|---------|---------|
| 0 | 0 | 0 | 0 | x | x | x |
| 0 | 0 | 0 | 1 | 3 | 1 | 1 |
| 0 | 0 | 1 | 0 | 2 | 1 | 0 |
| 0 | 0 | 1 | 1 | 2 | 1 | 0 |
| 0 | 1 | 0 | 0 | 1 | 0 | 1 |
| 0 | 1 | 0 | 1 | 1 | 0 | 1 |
| 0 | 1 | 1 | 0 | 1 | 0 | 1 |
| 0 | 1 | 1 | 1 | 1 | 0 | 1 |
| 1 | 0 | 0 | 0 | 0 | 0 | 0 |
| 1 | 0 | 0 | 1 | 0 | 0 | 0 |
| 1 | 0 | 1 | 0 | 0 | 0 | 0 |
| 1 | 0 | 1 | 1 | 0 | 0 | 0 |
| 1 | 1 | 0 | 0 | 0 | 0 | 0 |
| 1 | 1 | 0 | 1 | 0 | 0 | 0 |
| 1 | 1 | 1 | 0 | 0 | 0 | 0 |
| 1 | 1 | 1 | 1 | 0 | 0 | 0 |

| M1 | M2 | M3 | M4 | ASSR | PSA0(1) | PSA0(0) |
|---|---|---|---|---|---|---|
| 0 | 0 | 0 | 0 | x | x | x |
| 0 | 0 | 0 | 1 | 0 | x | x |
| 0 | 0 | 1 | 0 | 0 | x | x |
| 0 | 0 | 1 | 1 | 1 | 1 | x |
| 0 | 1 | 0 | 0 | 0 | x | x |
| 0 | 1 | 0 | 1 | 0 | x | x |
| 0 | 1 | 1 | 0 | 0 | x | x |
| 0 | 1 | 1 | 1 | 1 | 1 | x |
| 1 | 0 | 0 | 0 | 0 | x | x |
| 1 | 0 | 0 | 1 | 0 | x | x |
| 1 | 0 | 1 | 0 | 0 | x | x |
| 1 | 0 | 1 | 1 | 1 | 1 | x |
| 1 | 1 | 0 | 0 | 0 | 0 | x |
| 1 | 1 | 0 | 1 | 0 | 0 | x |
| 1 | 1 | 1 | 0 | 0 | 0 | x |
| 1 | 1 | 1 | 1 | 0 | 0 | x |
FIG. 37
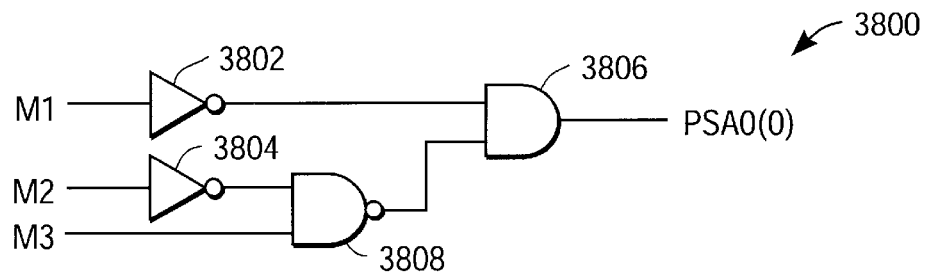
FIG. 38
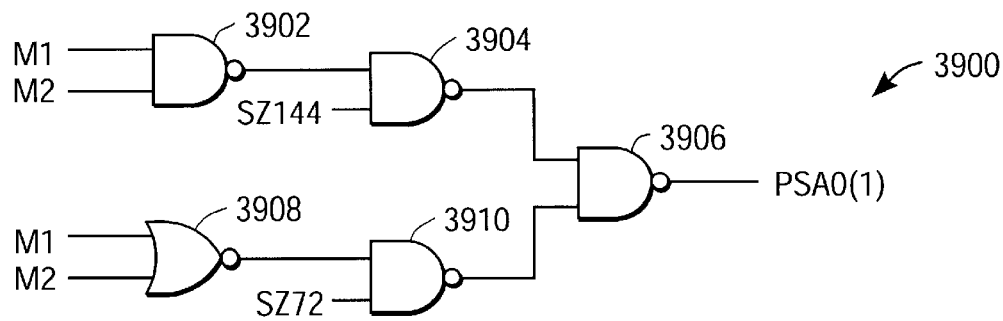
FIG. 39

| Configuration | PE Inputs |
|---|---|
| ZY × W | Set to M1-MZ for corresponding rows. |
| $\frac{ZY}{2}$ × 2W | Set every 2nd PE input to the corresponding first group match results;<br>Set all other PE inputs to mismatch. |
| $\frac{ZY}{4}$ × 4W | Set every 4th PE input in the corresponding second group match results;<br>Set all other PE inputs to mismatch. |
| ⋮ | ⋮ |
| $\frac{ZY}{(Z-1)}$ × (Z-1)W | Set every (Z-1) PE input to the corresponding (Z-1) group match results;<br>Set all other PE inputs to mismatch. |
| Y × ZW | Set every Zth PE input to the corresponding row group match results;<br>Set all other PE inputs to mismatch. |

INTRA-ROW CONFIGURABILITY OF CONTENT ADDRESSABLE MEMORY

FIELD OF THE INVENTION

The present invention relates generally to content addressable memories (CAMs), and more particularly to intra-row configurability of a CAM array.

BACKGROUND

A content addressable memory (CAM) system is a storage system that can be instructed to compare a specific pattern of comparand data with data stored in its associative CAM array. The entire CAM array, or segments thereof, is searched in parallel for a match with the comparand data. The CAM device typically includes a priority encoder to translate the highest priority matching location into a match address or CAM index.

The CAM array has rows of CAM cells that each store a number of bits of a data word. U.S. Pat. No. 5,440,715 describes a technique for expanding the width of the data words beyond that of a single row of CAM cells. This inter-row configurability provides flexibility in the use of the single CAM array to store data words larger than that available in a single addressable row of CAM cells.

It would be desirable to have a CAM system that includes intra-row configurability to provide additional flexibility in the use of a single CAM array to be used in multiple array configurations. Intra-row configurability is the ability to access and operate upon one or more segments of rows of CAM cells.

SUMMARY OF THE INVENTION

A CAM system having intra-row configurability is disclosed. For one embodiment, the CAM system includes a CAM array having a number of rows of CAM cells each segmented into row segments. Each row segment includes a number of CAM cells coupled to a corresponding match line segment. Individual row segments or groups of row segments are uniquely addressable by address logic in response to configuration information that indicates a width and depth configuration of the CAM array. The configuration information may be stored in a configuration register. Data may be communicated with an addressed row segment or group of row segments using data access circuitry. Priority encoding circuitry may be included to generate the address of a row segment or group of row segments that stores data matching comparand data in response to the configuration information. Match flag logic may also be included to determine when comparand data matches data stored in one of the row segments or one of the groups of row segments in response to the configuration information. Additionally, multiple match flag logic may be included to determine when comparand data matches data stored in each of a plurality of row segments and to determine when comparand data matches data stored in each of a plurality of groups of row segments in response to the configuration information.

Other objects, features, and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which:

FIG. 4 is one embodiment of a truth table for the select logic of FIG. 3;

FIG. 5 is one embodiment of a truth table for the segment decoder of FIG. 3;

FIG. 37 is another embodiment of a truth table for another operating configuration for the row priority encoder circuit of FIG. 35;

FIG. 38 is a logic diagram of one embodiment of the row priority encoder circuit of FIG. 35 for generating one segment address bit;

FIG. 39 is a logic diagram of one embodiment of the row priority encoder circuit of FIG. 35 for generating another segment address bit;

FIG. 44 is a table summarizing the function of the priority encoder interface circuits of FIG. 42;

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Additionally, the prefix symbol "/" or the suffix "B" attached to signal names indicates that the signal is an active low signal. Each of the active low signals may be changed to active high signals as generally known in the art.

A CAM system having intra-row configurability is disclosed. The intra-row configurability enables a single CAM array to be configured to operate in one of many different width and depth configurations. For example, a CAM array having Y rows of CAM cells each having Z row segments of W CAM cells can be configured into n different ZY/n depth by nW width configurations, where n is an integer from 1 to Z. For example, the CAM array can be configured as ZY rows of W cells when n=1, as ZY/2 rows of 2W cells when n=2, and so on up to Y rows of ZW cells when n=Z. A user can select or program one of the configurations by loading specific configuration information into the CAM system. This single CAM system can be configured to store and maintain many different desired table configurations. The CAM system may also be used to store and maintain multiple tables of different sizes. For example, a first section of the CAM array may be configured such that each row in the section has a first number of row segments, while a second section of the CAM array may be configured such that each row in that section has a different number of row segments.

Figure 1:
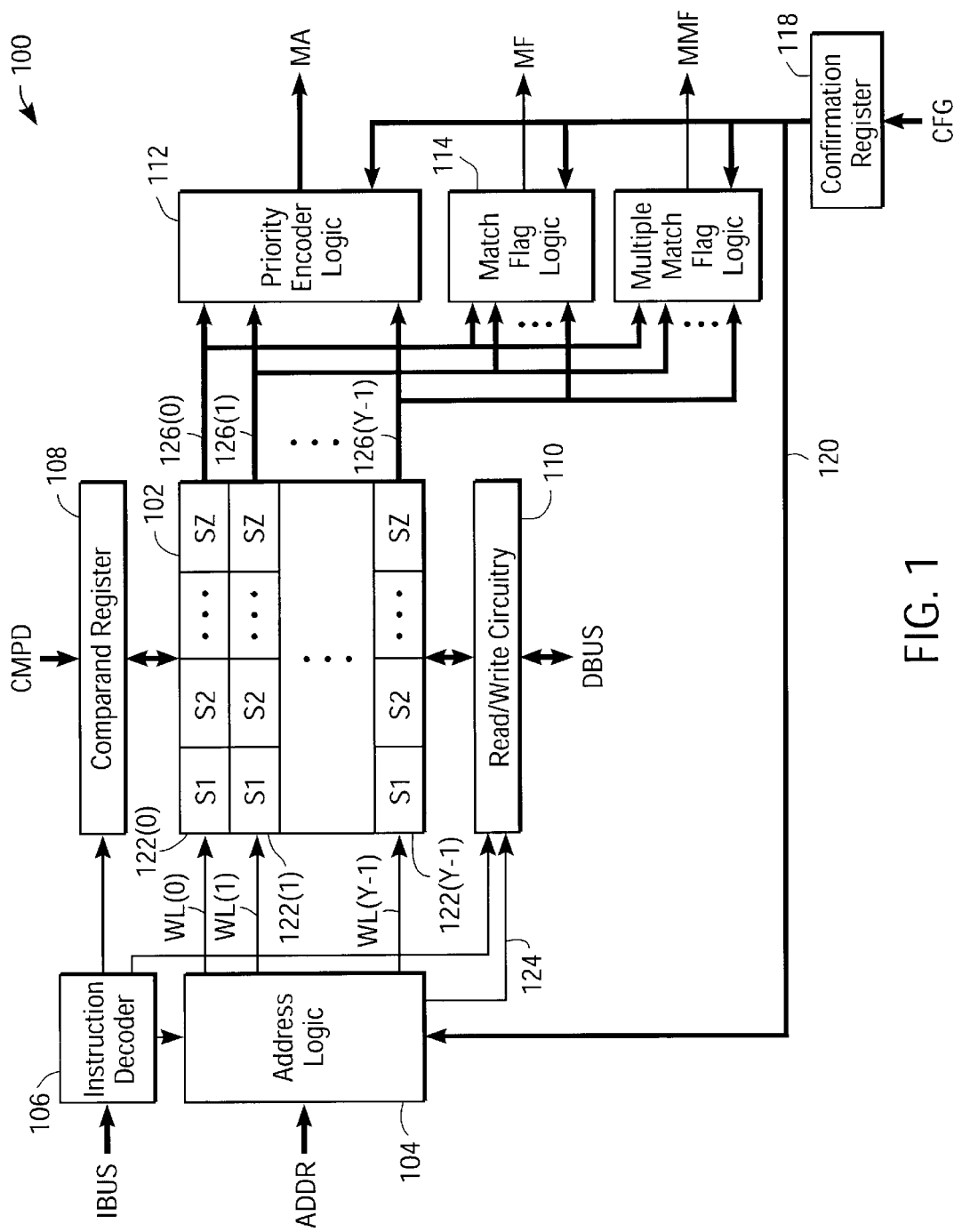
FIG. 1 is a block diagram of one embodiment of a configurable CAM system according to the present invention including a CAM array, comparand register, configuration register, address logic, read/write circuitry, an instruction decoder, priority encoder logic, match flag logic, and multiple match flag logic.

FIG. 1 is one embodiment of a CAM system 100 according to the present invention. CAM system 100 includes a CAM array 102 that includes Y rows 122(0)–122(Y−1) of CAM cells each segmented into Z row segments S1–SZ of W CAM cells each, where W, Y, and Z are any integer numbers. The W CAM cells that may be any type of CAM cells including binary and ternary CAM cells. One or more of the row segments may also include a different number of CAM cells.

CAM array 102 can be configured into n different ZY/n width by nW depth configurations, where n is an integer from 1 to Z. For one embodiment, Y=1024 (1k) rows, Z=4 segments, and W=72 cells per segment. These values for W, Y, and Z will be used throughout this application for example purposes only. For one example, the CAM array can be configured to operate in three different configurations: (1) 1k×288, (2) 2k×144, and (3) 4k×72 thus enabling a single CAM array to store and maintain a different table size in each different mode of operation.

For other embodiments, the CAM array can be configured on a row-by-row or section-by-section basis to store data words of ×72, ×144 or ×288 bits that span one or more rows of the CAM array. For example, a first half of the CAM array may be configured as 512×288, the next quarter configured as 512×144 and the final quarter configured as 1k×72. This flexibility allows the CAM system to store and maintain multiple tables of different sizes.

Configuration information CFG is used to program CAM system 100 to operate CAM array 102 in one of the multiple array configurations. The configuration information includes one or more signals that indicate the operating configuration of the CAM array and the CAM system. For example, a separate configuration or control signal may be associated with each configuration of the system. The configuration information may be stored in configuration register 118 and subsequently provided over bus 120 to address logic 104, priority encoder logic 112, match flag logic 114 and/or multiple match flag logic 116. Alternatively, configuration register 118 may be omitted and the configuration information provided directly to one or more of the various circuit blocks. For another embodiment, the configuration information may be provided as part of read, write or compare instructions on the instruction bus IBUS to instruction decoder 106.

Instruction decoder 106 decodes various instructions provided on instruction bus IBUS. The instructions may include instructions to write data to one or more row segments of the CAM array, read data from one or more row segments of the CAM array, and to compare comparand data with one or more row segments of the CAM array. The comparand data may be provided on the comparand bus CBUS and stored in comparand register 108 or directly provided to CAM array 102. The CAM system may also include one or more global mask registers (not shown) for the comparand data provided to the CAM array 102.

The instruction decoder provides various control signals to the address logic, read/write circuitry, and comparand register to control when the CAM system performs one of the operations. Additionally, the instruction decoder may provide one or more control signals to CAM array 102, priority encoder logic 112, match flag logic 114, multiple match flag logic 116, and configuration register 118 to enable these circuits to perform their associated functions at an appropriate time. For an alternative embodiment, instruction decoder 106 may be omitted and various read, write and compare control signals may be provided directly to one or more of the circuit blocks.

Reading and Writing Data

Data can be communicated with the various row segments using address logic 104 and read/write (data access) circuitry 110. Address logic 104 uniquely addresses one row segment or a group of row segments in response to the configuration information and an input address provided on address bus ADDR. The address logic decodes the input address and outputs a decoded row address and a decoded segment address. The decoded row address enables one of the rows of CAM cells via word lines WL(0)–WL(Y–1), and the decoded segment address is provided on bus 124 to the read/write circuitry to selectively enable one or more of the row segments to communicate data with the data bus DBUS. The configuration information provided to address logic 104 determines whether the decoded segment address provided to the read/write circuitry enables one row segment to communicate with the data bus, or enables a group of row segments to communicate with the data bus. For example, when the CAM array is configured in ZY (rows)×W (cells) mode (e.g., 4k×72), each decoded segment address uniquely addresses one row segment of a selected row such that data can be written to or read from a particular row segment by asserting the corresponding word line and enabling the row segment to communicate with DBUS through read/write circuitry 110. When the CAM array is configured in other configurations, each decoded segment address uniquely addresses a group of row segments. Data may be simultaneously communicated with the entire group of row segments, or data may be communicated on a segment-by-segment basis within the addressed group.

Figure 2:
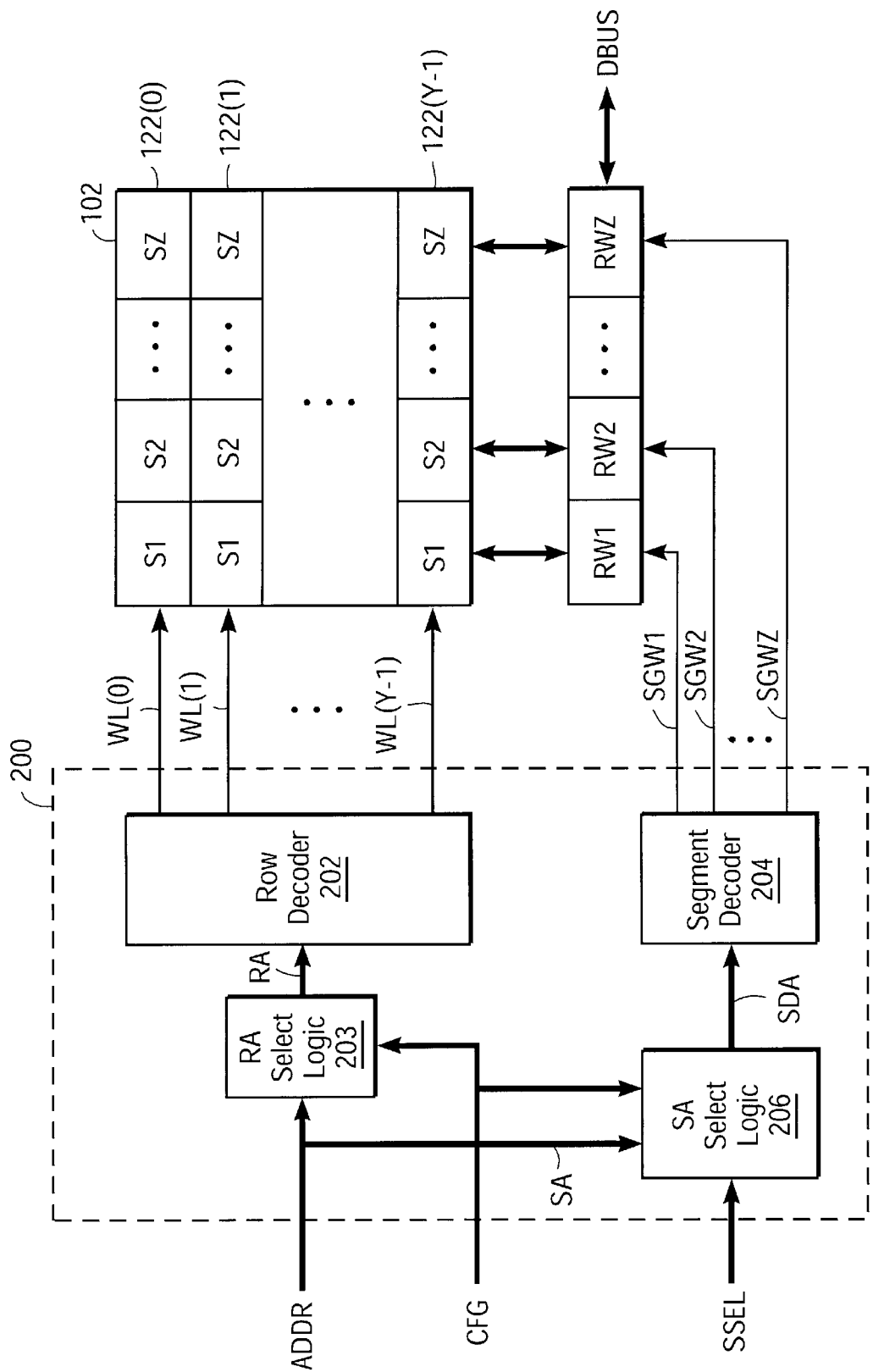
FIG. 2 is a block diagram of one embodiment of the address logic of FIG. 1 including a row decoder, row address select logic, segment address select logic, and a segment decoder.

FIG. 2 shows address logic 200 that is one embodiment of address logic 104 of FIG. 1. Address logic 200 includes row decoder 202, row address (RA) select logic 203, segment decoder 204, and segment address (SA) select logic 206. Row decoder 202 receives and decodes row address RA to select and enable one of the word lines WL(0)–WL(Y–1). The word lines are each connected to all of the row segments of one of the corresponding rows 122(0)–122(Y–1). When a word line is enabled, data may be written to or read from a CAM cell in a conventional manner. For an alternative embodiment, each row segment may be connected to its own word line. In response to the configuration information, RA select logic 203 determines which address signals of an input address on ADDR are provided as RA to the row decoder.

Segment decoder 204 receives and decodes the segment decoder input address SDA to select and enable one of segment enable lines SEN1–SENZ. Each segment enable line selectively enables a corresponding read/write circuit RW1–RWZ to communicate data between the DBUS and a corresponding row segment S1–SZ, respectively, of the selected row of CAM cells. Each read/write circuit includes conventional read and write circuits such as sense amplifiers and data drivers.

Segment decoder 204 receives SDA from SA select logic 206. In response to the configuration information on bus 120, SA select logic 206 determines SDA from the segment address SA provided on address bus ADDR, the segment select signals SSEL, or from a combination of both. The segment address uniquely identifies the address of a row segment or a group of row segments for a selected row of CAM cells. The segment select signals may be used to uniquely address and access one of the row segments within an addressed group of row segments.

Figure 3:
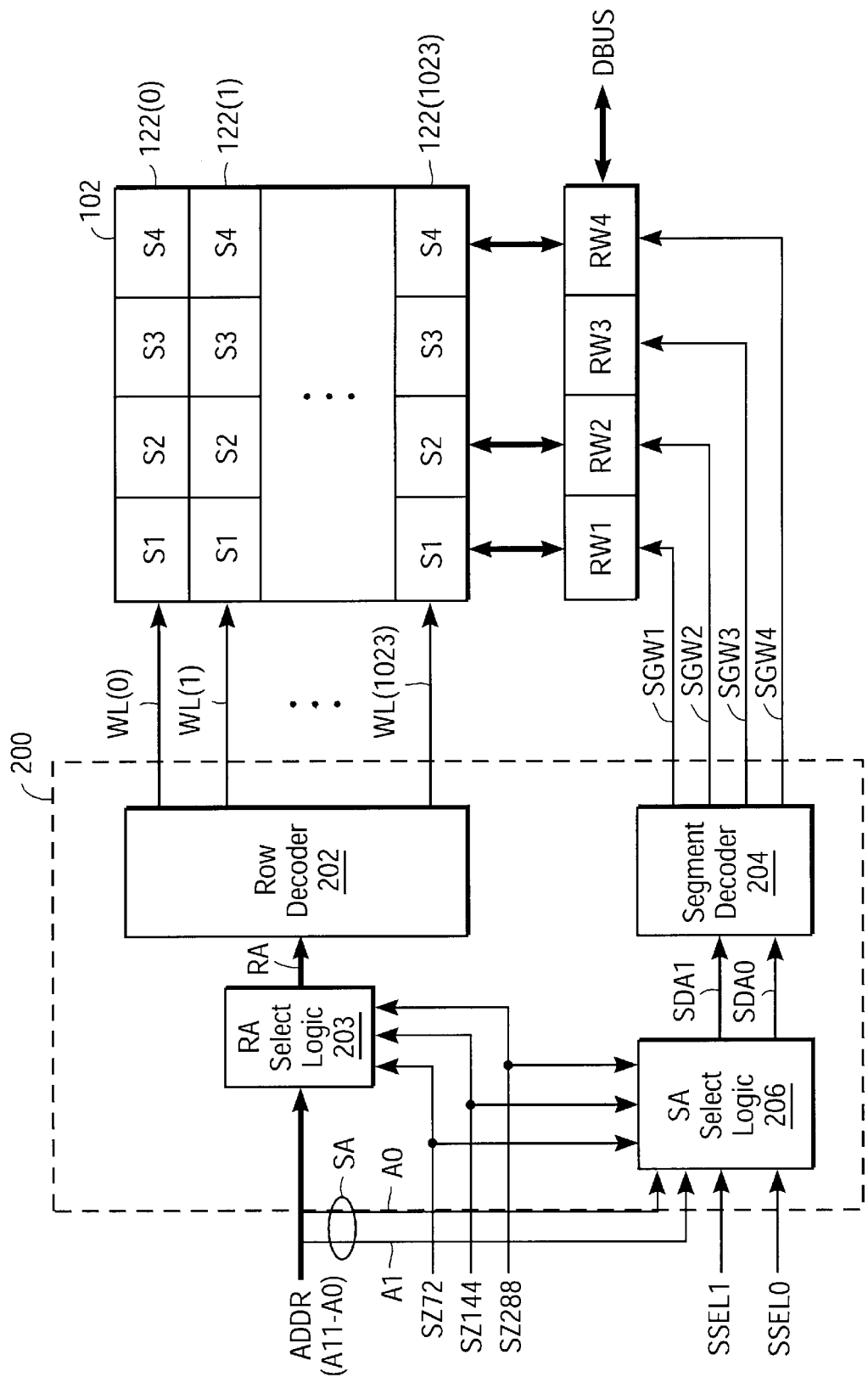
FIG. 3 is one example of the address logic of FIG. 2 for particular configurations of the CAM system.

The operation of address logic 200 is further illustrated in FIG. 3 in which CAM array has Y=1024 rows 122(0)–122(1023), Z=4 row segments S1–S4 per row, and each row segment having W=72 CAM cells. Other configurations may be used. The CAM array may be configured to operate in three different modes in response to the configuration signals SZ72, SZ144 and SZ288. When SZ72 is enabled, the CAM array operates in a 4k×72 mode; when SZ144 is enabled, the CAM array operates in a 2k×144 mode; and when SZ288 is enabled, the CAM array operates in a 1k×288 mode. A summary of the inputs address signals, RA, SA, SDA and SEN1–SEN4 used and generated for this example is shown in the truth tables of FIGS. 4 and 5.

The input address on the address bus has twelve bits A11–A0. In the 4k×72 mode, all twelve bits A11–A0 are used to uniquely address each of the 4k row segments in CAM array 102. Bits A11–A2 are selected by RA select logic 203 and are used as the row address for row decoder 202 to select one of the CAM rows; and bits A1–A0 are provided to SA select logic 206 and used to select one of the row segments for a selected row of cells. In this mode, SZ72 is enabled and SA select logic 206 provides A1 and A0 as SD1 and SD0, respectively, to segment decoder 204. A1 and A0 are decoded by segment decoder 204 to generate SEN1–SEN4 and select a particular row segment in a selected row of cells for communication.

In the 2k×144 mode, eleven bits A10–A0 are used to uniquely address each of the 2k groups of row segments in CAM array 102. Each group of row segments includes two row segments. The most significant bit A11 does not participate in addressing a group of row segments. Bits A10–A1 are selected by RA select logic 203 as the row address and are used by row decoder 202 to select one of the CAM rows; and bit A0 is provided to SA select logic 206 and used to select one of the groups of row segments for a selected row of cells. In this mode, SZ144 is enabled and SA select logic 206 provides A0 as SD1 to segment decoder 204, and provides SSEL0 as SD0 to segment decoder 204. A0 and SSEL0 are decoded by segment decoder 204 to generate SEN1–SEN4 and select for communication a particular group of row segments in a selected row of cells in response to A0, and to select for communication a particular row segment in the selected group in response to SSEL0. Thus, if an input address of 0000000000001 is provided as A11–A0, respectively, to address the group of row segments S3–S4 of row 122(0), A10–A1 will address row 122(0), A0 will address row segment S3, and SSEL0 can be used select row segment S4.

In the 1k×288 mode, ten bits A9–A0 are used to uniquely address each of the 1k groups of row segments in CAM array 102. Each group of row segments includes four row segments (i.e., an entire row). The most significant bits A11–A10 do not participate in addressing a group of row segments. Bits A9–A0 are selected by RA select logic 203 as the row address and are used by row decoder 202 to select one of the CAM rows. In this mode, SZ288 is enabled and SA select logic 206 provides SSEL1 and SSEL0 as SD1 and SD0, respectively, to segment decoder 204. SSEL1 and SSEL0 are decoded by segment decoder 204 to generate SEN1–SEN4 and select a particular row segment in a selected row of cells for communication. Thus, if an input address of 0000000000001 is provided as A11–A0, respectively, to address the group of row segments S1–S4 of row 122(1), A9–A0 will address row 122(1), and SSEL1 and SSEL0 can be used to select each of row segments S1–S4.

Figure 6A:
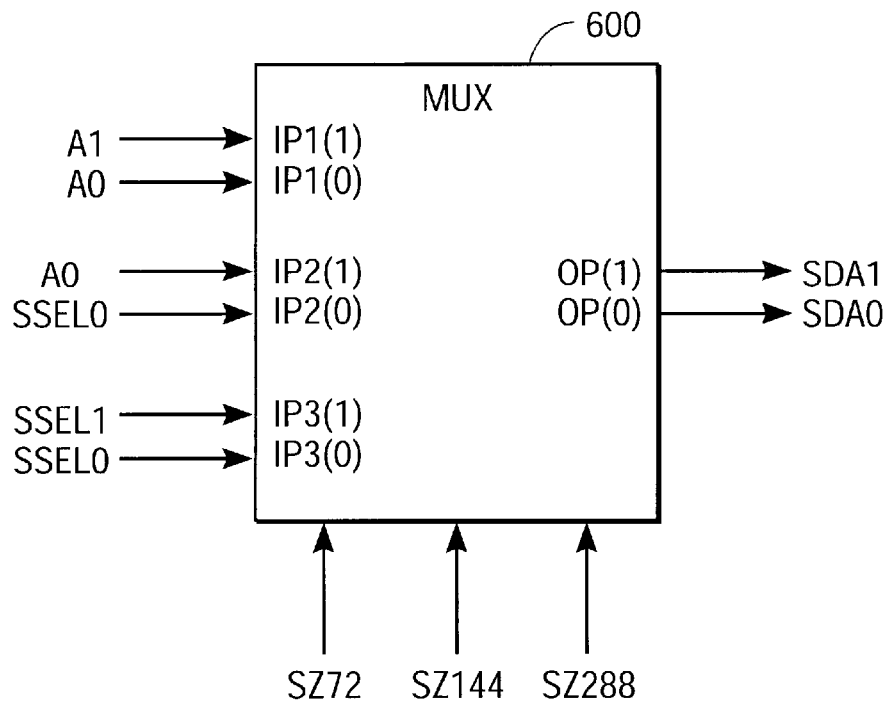
FIG. 6A is a logic diagram of one embodiment of the segment address select logic of FIG. 3.

FIG. 6A shows multiplexer 600 that is one embodiment of SA select logic 206 of FIG. 3. Other embodiments may be used for SA select logic 206. Multiplexer 600 includes three input ports IP1, IP2, and IP3 for receiving A1 and A0, A0 and SSEL0, and SSEL1 and SSEL0, respectively. When SZ72 is enabled, A1 and A0 are provided to the output port as SDA1 and SDA0. When SZ144 is enabled, A0 and SSEL0 are provided to the output port as SDA1 and SDA0. Finally, when SZ288 is enabled, SSEL1 and SSEL0 are provided to the output port as SDA1 and SDA0. For other embodiments, SA select logic 206 may be implemented such that A1 and A0 are logically ANDed with SZ72, A0 and SSEL0 are logically ANDed with SZ144, SSEL1 and SSEL0 are logically ANDed with SZ288, and the results of the AND functions are logically ORed together to provide SEN1–SEN4.

Figure 6B:
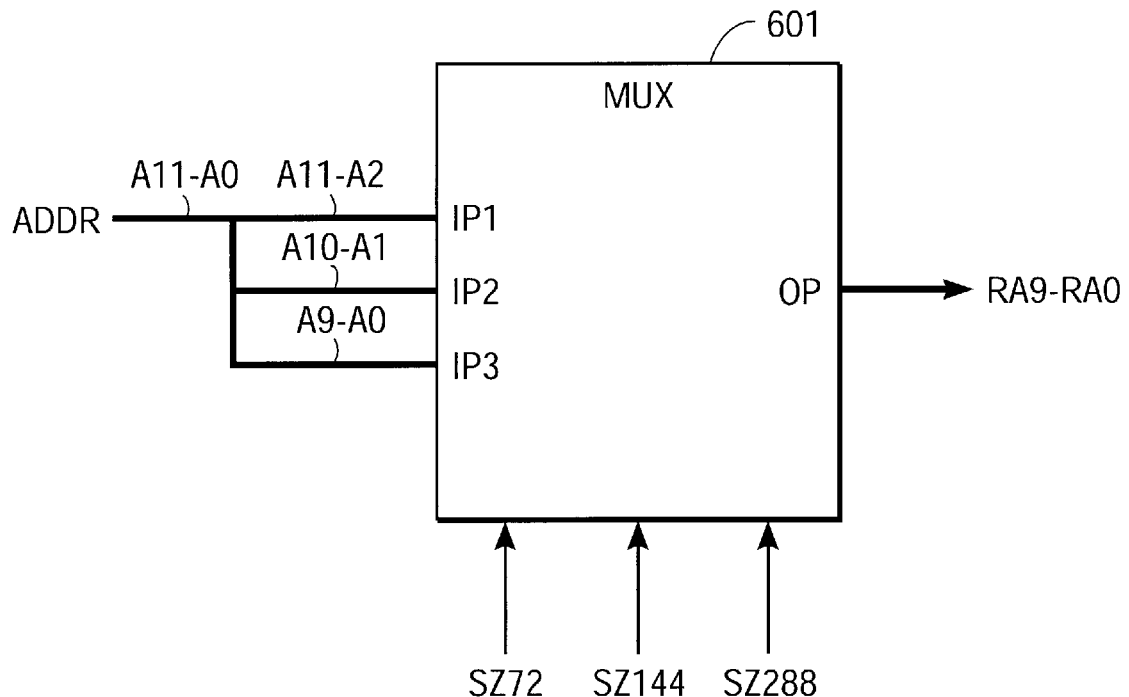
FIG. 6B is a logic diagram of one embodiment of the row address select logic of FIG. 3.

FIG. 6B shows multiplexer 601 that is one embodiment of RA select logic 203 of FIG. 3. Other embodiments may be used for RA select logic 206. Multiplexer 601 includes three input ports IP1, IP2, and IP3 for receiving A11–A2, A10–A1 and A9–A0, respectively. When SZ72 is enabled, A11–A2 are provided to the output port as RA9–RA0. When SZ144 is enabled, A10–A1 are provided to the output port as RA9–RA0. Finally, when SZ288 is enabled, A9–A0 are provided to the output port as RA9–RA0. For other embodiments, RA select logic 203 may be implemented such that each of A11–A2 is logically ANDed with SZ72, each of A10–A1 is logically ANDed with SZ144, each of A9–A0 is logically ANDed with SZ288, and the results of the AND functions are logically ORed together to provide RA9–RA0.

FIG. 3 disclosed a particular example of the operation of decoder 200 for a particular number of possible CAM array configurations. The method used in the example of FIG. 3 can be readily extended to accommodate any number of configurations of any size CAM array having any number of row segments each having any number of CAM cells. For example, a CAM array having more row segments can be accommodated by supplying more address bits (SA), select signals, and configuration signals to SA select logic 206 (and/or RA select logic 203), and increasing the number of SDA bits, the size of segment decoder 204 and the number of segment enable signals. In general, the row address will have $\log_2$ Y bits to select one of the Y word lines, and the SA address, SSEL and SDA will each have up to $\log_2$ Z bits to address one of the Z segment enable lines.

Figure 7:
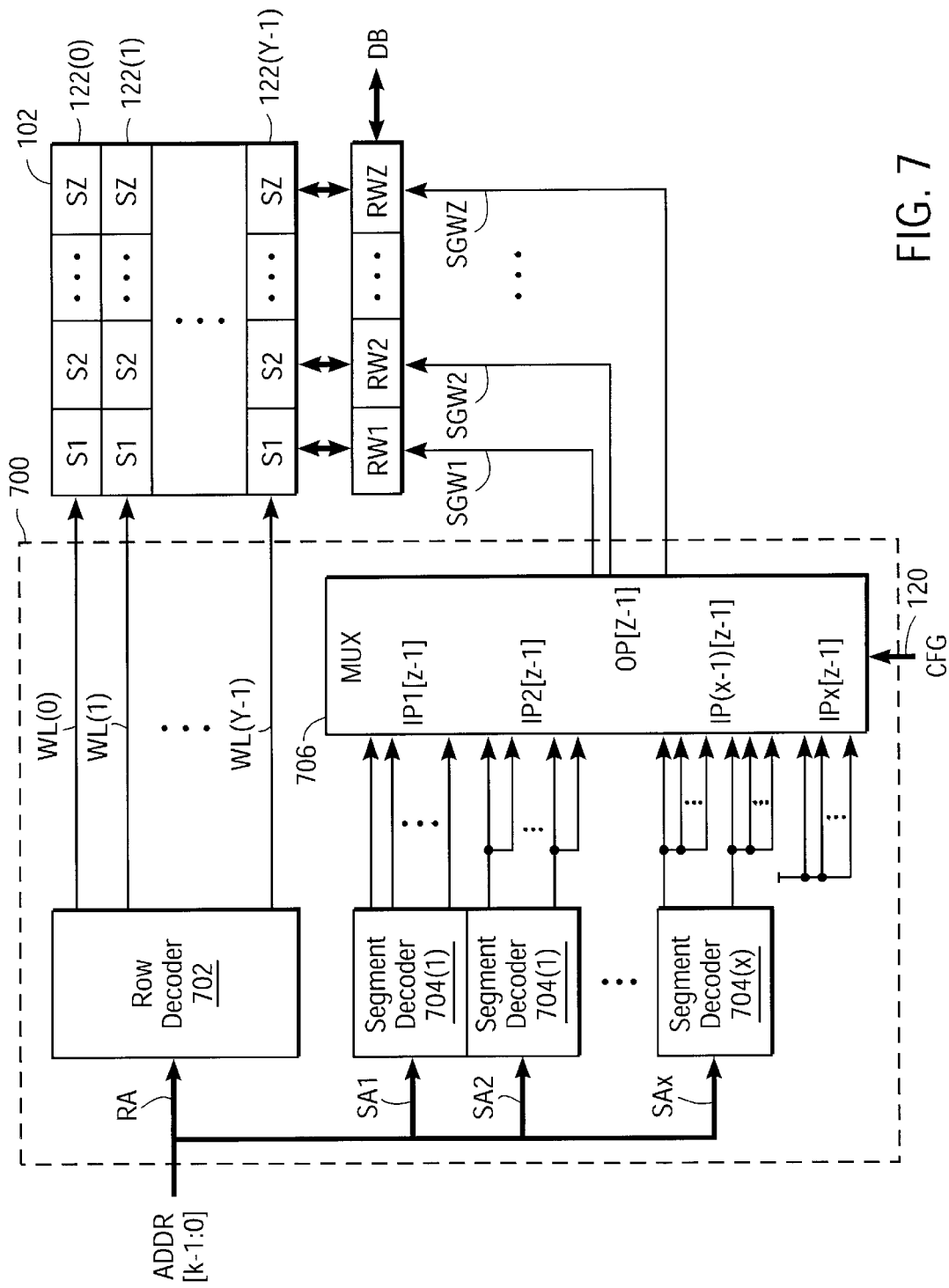
FIG. 7 is block diagram of another embodiment of the address logic of FIG. 1 including a row decoder, segment decoders, and a multiplexer.

FIG. 7 shows address logic 700 that is another embodiment of address logic 104 of FIG. 1. Address logic 700 includes a row decoder 702, segment decoders 704(1)–704(x), and multiplexer 706. Row decoder 702 receives and decodes row address RA to select and enable one of the word lines WL(0)–WL(Y−1). Segment decoders 704(1)–704(x) each receive and decode a corresponding segment address SA1–SAx to select and enable one or more of the segment enable lines SEN1–SENZ. The decoded segment addresses are provided to input ports IP1–IP(x−1) of multiplexer 706 and selectively provided to SEN1–SENZ in response to the configuration information on bus 120. The last input port IPx has all of its inputs connected to a logic one state.

Each segment address SA1–SAx has a different number of address bits of the input address on address bus ADDR. For example, in ZY×W mode, row address RA uses $\log_2$ Y of the most significant address bits to address one of the rows of CAM cells, and SA1 includes $\log_2$ Z of the least significant address bits such that segment decoder 704(1) generates Z signals. Multiplexer 706 provides the Z signals as SEN1–SENZ in response to the configuration information indicating the ZY×W mode. Note that the total number of address bits of the input address on ADDR equals the sum of $\log_2$ Y and $\log_2$ Z.

In ZY/2×2W mode, each pair of row segments is uniquely addressable. In this mode, row address RA uses $\log_2$ Y of the most significant address bits to address one of the rows of CAM cells. Input address bit 0 is ignored (e.g., set to a zero logic state) and the balance of the least significant address bits are used for SA2 (i.e., $\log_2$ (Z/2) bits) such that segment decoder 704(2) generates Z/2 signals. The Z/2 signals are used for every other input of input port IP2. Each decoded signal is duplicated to provide the other inputs for input port IP2 as shown in FIG. 7. The signals are duplicated to simultaneously enable a pair of segment enable signals and simultaneously communicate data with a pair of uniquely addressable row segments. Multiplexer 706 provides the Z signals as SEN1–SENZ in response to the configuration information indicating the ZY/2×2W mode.

Each successive SA, associated with additional configurations, has one fewer address bit until SAx provides a single address bit to the last segment decoder 704(x) associated with mode ZY/(Z−1)×(Z−1)W. In this mode, segment decoder outputs two decoded signals. The first decoded signal is duplicated for the first Z/2 inputs to input port IP(x−1) to simultaneously enable SEN1–SEN(Z/2) for a selected row, and the second decoded signal is duplicated for the second Z/2 inputs to input port IP(x−1) to simultaneously enable SEN(Z/2)–SENZ for a selected row. The last input port IPx is associated with Y×ZW mode, and has all inputs tied to a high logic state to enable all of the segment enable signals and address an entire row of row segments with in this mode.

Figure 8:
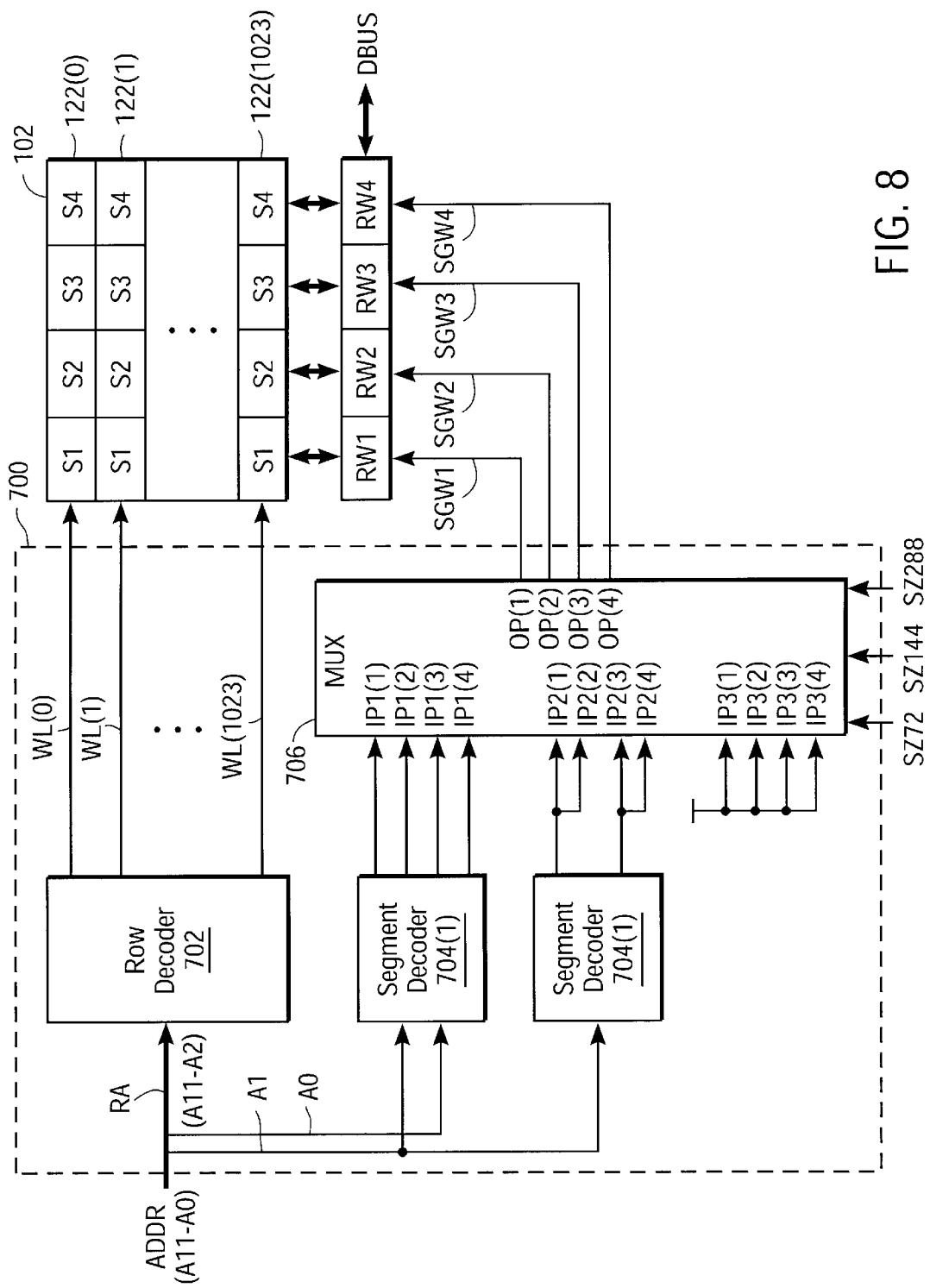
FIG. 8 is one example of the address logic of FIG. 7 for particular configurations of the CAM system.

The operation of address logic 700 is further illustrated in FIG. 8 in which CAM array has Y=1024 rows 122(0)–122(1023), Z=4 row segments S1–S4 per row, and each row segment having W=72 CAM cells. Other configurations may be used. The CAM array may be configured to operate in three different modes in response to the configuration signals SZ72, SZ144 and SZ288.

In the 4k×72 mode, all twelve bits A11–A0 on address bus ADDR are used to uniquely address each of the 4k row segments in CAM array 102. The most significant ten bits A11–A2 are used as the row address for row decoder 702 to select one of the CAM rows, and bits A1–A0 are decoded by 2-to-4 segment decoder 704(1) to select one of the row segments for a selected row of cells. In this mode, SZ72 is enabled and multiplexer 706 provides the output of segment decoder 704(1) to segment enables lines SEN1–SEN4.

In the 2k×144 mode, eleven bits A11–A1 are used to uniquely address each of the 2k groups of row segments in CAM array 102. Each group of row segments includes two row segments. The most significant ten bits A11–A2 are used as the row address for row decoder 702 to select one of the CAM rows, and bit A1 is decoded by 1-to-2 segment decoder 704(1) to select one pair of the row segments for a selected row of cells. The least significant bit A0 does not participate in addressing a group of row segments. In this mode, SZ144 is enabled and multiplexer 706 provides the input signals on input port IP2 to segment enables lines SEN1–SEN4. Thus, if an input address of 000000000001 is provided as A11–A0, respectively, to address the group of row segments S3–S4 of row 122(0), A11–A2 will address row 122(0), and SEN3 and SEN4 will enable simultaneous communication with row segments S3 and S4.

In the 1k×288 mode, ten bits A11–A2 are used to uniquely address each of the 1k groups of row segments in CAM array 102. Each group of row segments includes four row segments (i.e., an entire row). The most significant ten bits A11–A2 are used as the row address for row decoder 702 to select one of the CAM rows. In response to SZ288, multiplexer 706 provides and the all logic one states of input port IP3 to SEN1–SEN4. This enables an entire selected row to simultaneously communicate with the data bus. The least significant bits A1 and A0 do not participate in addressing a group of row segments.

Loading the Comparand Data

With reference again to FIG. 1, comparand data may be compared with the data stored in one or more of the row segments in array 102. The comparand data may be provided on comparand bus CBUS and stored in comparand register 108, or provided directly to array 102 for comparison.

For one embodiment, the width of the CBUS is the same as the total number of CAM cells in a row of CAM cells (i.e., ZW bits). When the system is configured in ZY×W mode, Z copies of the comparand data can be loaded into the comparand register for comparison with each of the Z segments in each row 122. Similarly, in the ZY/2×2W mode, Z/2 copies of the comparand data can be loaded into the comparand register. This methodology can be used until in the Y×ZW mode, the comparand data is as wide (has as many bits) as an entire row 122.

Figure 9:
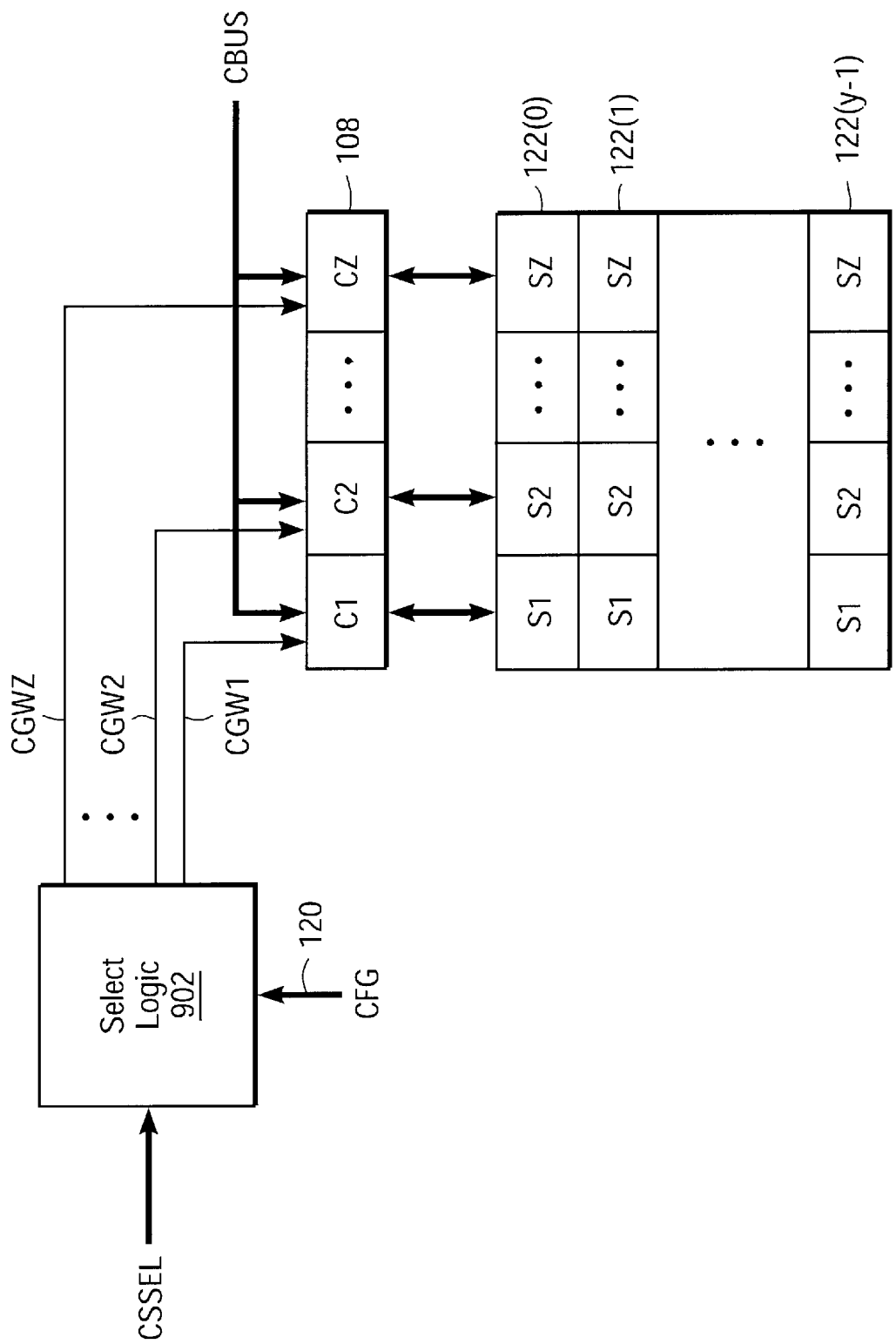
FIG. 9 is a block diagram of one embodiment of circuitry to load comparand data into the comparand register.

For other embodiments, the CBUS may have a smaller number of bits than the total number of bits for the rows 122. For one example, the width of the CBUS may be the same as the number of CAM cells in a row segment (i.e., W bits) and the comparand data sequentially and successively provided to each of the row segments S1–SZ for comparison. The comparand register may be segmented into Z segments each corresponding to one of the Z row segments in each of rows 122 as shown in FIG. 9. Comparand data can be separately loaded into each of the segments C1–CZ of the comparand register by enabling signals CEN1–CENZ, respectively. Select logic 902 generates the enable signals in response to the comparand segment select signals CSSEL and the configuration information. The CSSEL signals may be generated by the instruction decoder 106 in response to a compare instruction, or may be separately generated by the user. When the system is configured in ZY×W mode, the CSSEL signals cause select logic 902 to enable all CEN signals such that the same comparand data is simultaneously written into all of C1–CZ. In the ZY/2×2W mode (i.e., two row segments per group), the CSSEL signals cause select logic 902 to enable the odd CEN signals CEN1, CEN3, etc. such that the same first portion of comparand data is written into the first comparand segments associated with the first row segments S1, S3, etc. In a subsequent cycle, the CSSEL signals cause select logic 902 to enable the even CEN signals CEN2, CEN4, etc. such that the same second portion of comparand data is written into the second comparand segments associated with the second row segments S2, S4, etc. The first and second portions of comparand data together form the entire (2W) comparand data. This methodology continues until in the Y×ZW mode, the CEN signals are sequentially enabled to consecutively load each portion (W) of the ZW comparand data into one of the Z comparand segments. The operation of this embodiment is further illustrated by the example of FIG. 10.

Figure 10:
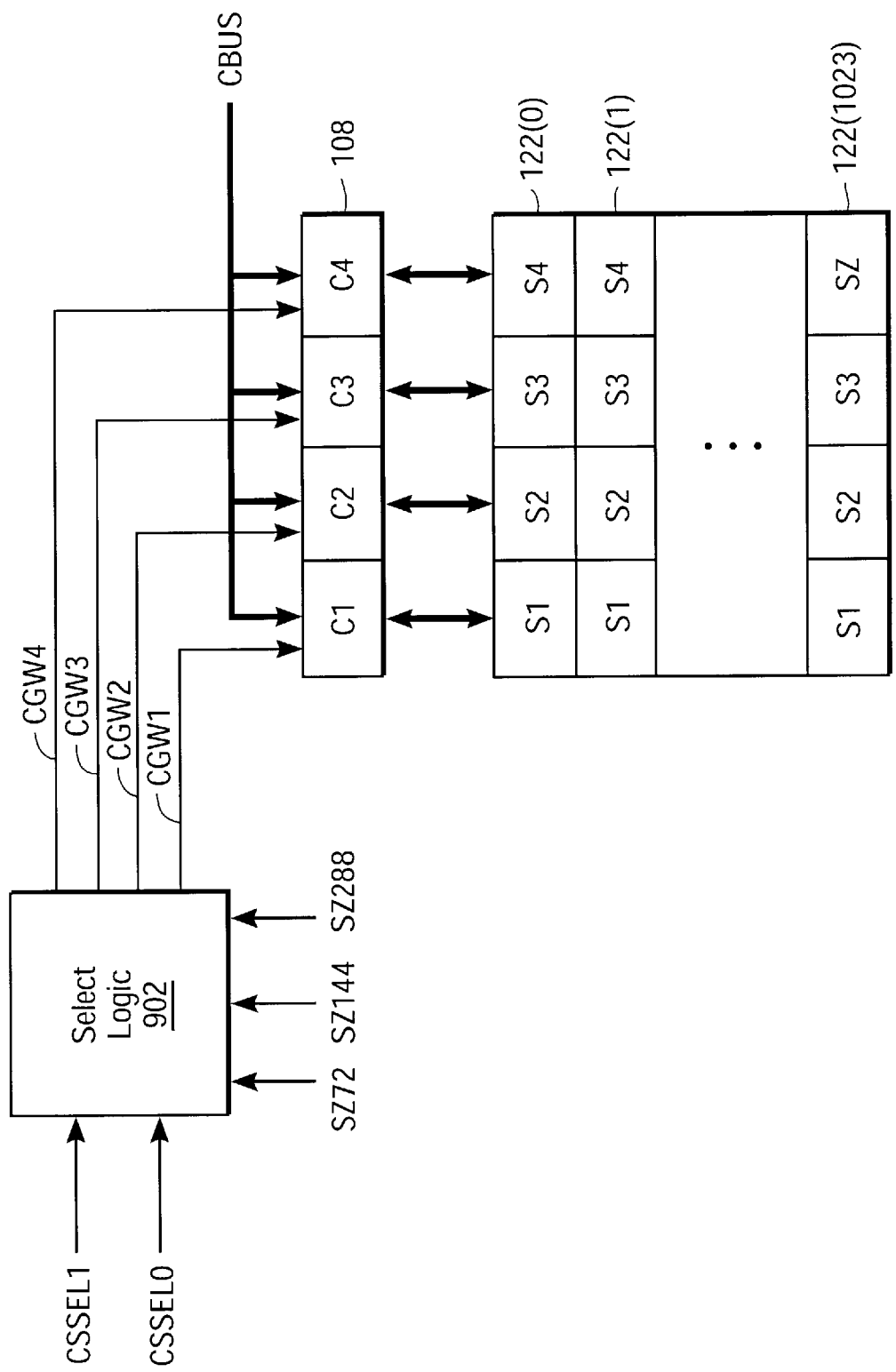
FIG. 10 is one example of the logic of FIG. 9 for particular configurations of the CAM system.
Figures 11, 12:
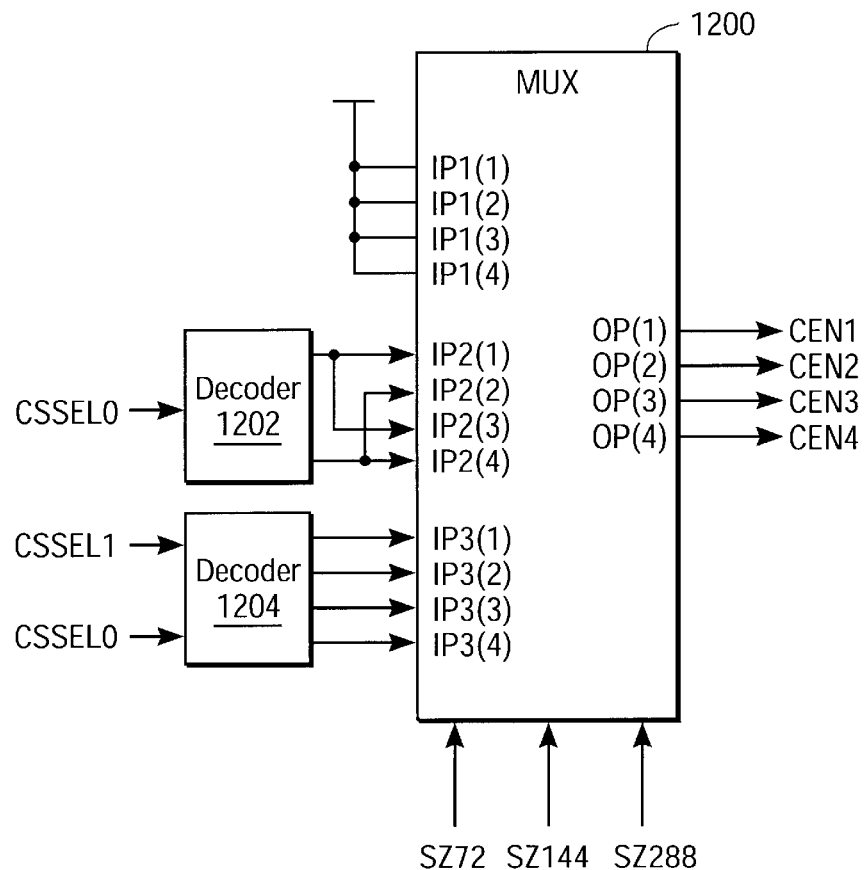
FIG. 11 is one embodiment of a truth table for the select logic of FIG. 10.
FIG. 12 is a logic diagram of one embodiment of the select logic for the truth table of FIG. 11.

FIG. 10 shows an example in which the CAM array has Y=1024 rows 122(0)–122(1023), Z=4 row segments S1–S4 per row, and each row segment has W=72 CAM cells. The CBUS is also 72 bits wide and provides 72-bit comparand data to each of comparand segments C1–C4 under the control of enable signals CEN1–CEN4, respectively. Select logic 902 generates the enable signals in response to CSSEL1 and CSSEL0 and the configuration signals SZ72, SZ144 and SZ288. The truth table for the operation of select logic 902 for this embodiment is shown in FIG. 11. When SZ72 is enabled, the CAM array operates in a 4k×72 mode, and CEN1–CEN4 are all enabled to simultaneously load the same 72-bit comparand data from the CBUS. When SZ144 is enabled, the CAM array operates in a 2k×144 mode and CSSEL0 determines which CEN signals are enabled. First, C1 and C3 are enabled to receive a first portion of the comparand data when CSSEL is in a logic zero state. Subsequently, C2 and C4 are enabled to receive a second portion of the comparand data when CSSEL0 is in a logic one state. When SZ288 is enabled, the CAM array operates in a 1k×288 mode and both CSSEL1 and CSSEL0 determine when each of the CEN signals are enabled to receive comparand data. In this mode, select logic 902 operates as a 2-to-4 decoder.

FIG. 12 shows multiplexer 1200 that is one embodiment of select logic 902 of FIG. 10 for implementing the truth table of FIG. 11. Other embodiments may be used. Multiplexer 1200 includes three input ports IP1, IP2, and IP3, an output port OP, and receives the configurations signals as select signals. Input port IP1 has all its inputs connected to a logic one state. Input port IP2 has its inputs coupled to 1-to-2 decoder 1202. Decoder 1202 decodes CSSEL0 and has its first decoded output connected to IP2(1) and IP2(3), and has its second decoded output connected to IP2(2) and IP2(4). Input port 3 has its inputs coupled to the outputs of 2-to-4 decoder 1204. Decoder 1204 decodes CSSEL1 and CSSEL0. When SZ72 is enabled, IP1 provides all logic one states to the output port to enable CEN1–CEN4. When SZ144 is enabled, the inputs of IP2 are provided to the output port. When SZ288 is enabled, the inputs of IP3 are provided to the output port.

Figure 13:
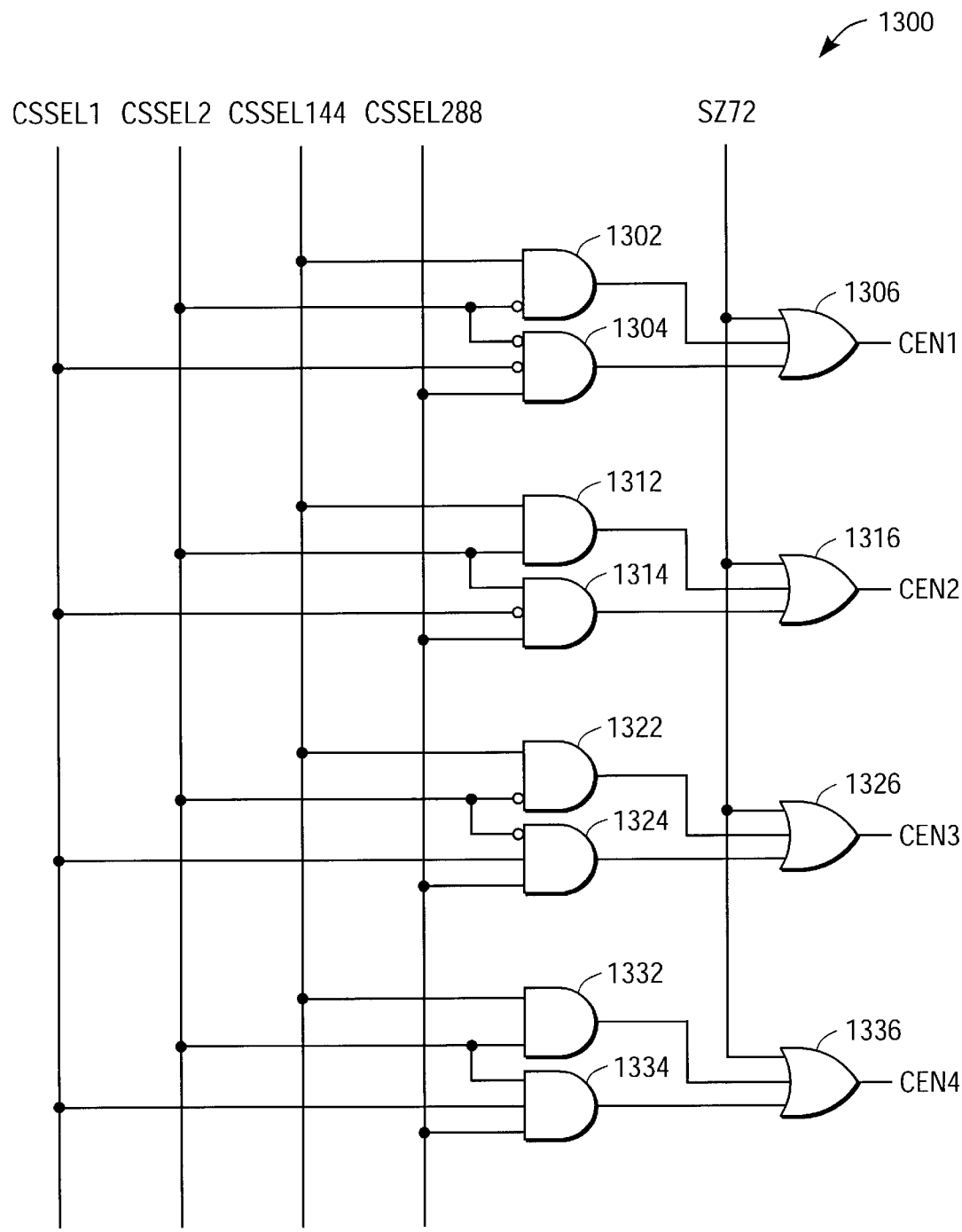
FIG. 13 is a logic diagram of another embodiment of the select logic for the truth table of FIG. 11.

FIG. 13 shows another embodiment of select logic 902 of FIG. 10 using AND/OR logic. Other embodiments may be used. Select logic 1300 includes a separate AND/OR circuit to generate the CEN signals in response to CSSEL1, CSSEL0, SZ72, SZ144 and SZ288 in accordance with the truth table of FIG. 11. For example, AND gates 1302 and 1304, and OR gate 1306 generate CEN1. AND gate 1302 has a first input coupled to SZ144, a second input coupled to the logical complement of CSSEL0, and an output coupled to an input of OR gate 1306. AND gate 1304 has a first input coupled to SZ288, a second input coupled to the logical complement of CSSEL0, a third input coupled to the logical complement of CSSEL1, and an output coupled to another input of OR gate 1306. OR gate 1306 also receives SZ72 and outputs CEN1. AND gates 1312 and 1314, and OR gate 1316 generate CEN2. AND gate 1312 has a first input coupled to SZ144, a second input coupled to CSSEL0, and an output coupled to an input of OR gate 1316. AND gate 1314 has a first input coupled to SZ288, a second input coupled to CSSEL0, a third input coupled to the logical complement of CSSEL1, and an output coupled to another input of OR gate 1316. OR gate 1316 also receives SZ72 and outputs CEN2. AND gates 1322 and 1324, and OR gate 1326 generate CEN3. AND gate 1322 has a first input coupled to SZ144, a second input coupled to the logical complement of CSSEL0, and an output coupled to an input of OR gate 1326. AND gate 1324 has a first input coupled to SZ288, a second input coupled to the logical complement of CSSEL0, a third input coupled to CSSEL1, and an output coupled to another input of OR gate 1326. OR gate 1326 also receives SZ72 and outputs CEN3. Similarly, AND gates 1332 and 1334, and OR gate 1336 generate CEN4. AND gate 1332 has a first input coupled to SZ144, a second input coupled to CSSEL0, and an output coupled to an input of OR gate 1336. AND gate 1334 has a first input coupled to SZ288, a second input coupled to CSSEL0, a third input coupled to CSSEL1, and an output coupled to another input of OR gate 1336. OR gate 1336 also receives SZ72 and outputs CEN4.

Match Flag

With reference again to FIG. 1, the comparand data may be compared with the data stored in one or more of the row segments in array 102. Match results for comparison with each row segment are indicated on a corresponding match line segment. Each of the Z match line segments 126(0)–126(Y–1) for a row of CAM cells are provided to match flag logic 114. The match flag logic generates a match signal MF indicative of when there is at least one match condition in array 120 with the comparand data. Match flag logic 114 is also responsive to the configuration information on bus 120 such that MF is appropriately enabled for the corresponding configuration of system 100. For example, when array 102 is in ZY×W mode, match flag logic 114 determines if the comparand data matches valid data stored in at least one row segment of array 102. When array 102 is configured in another mode utilizing groups of row segments (i.e., n greater than one for ZY/n×nW), match flag logic 114 determines if the comparand data matches valid data stored in at least one group of row segments of array 102.

Figure 14:
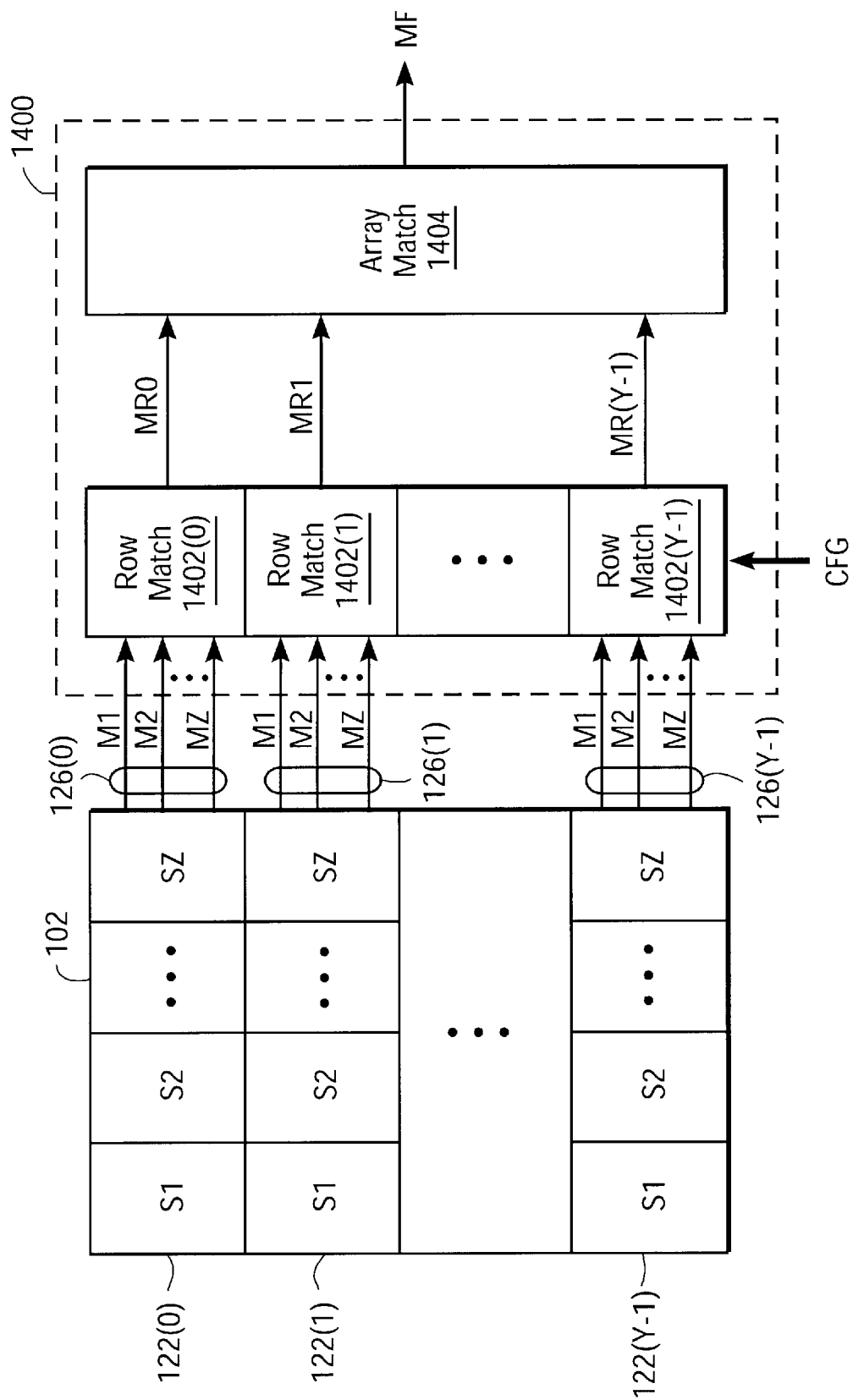
FIG. 14 is a block diagram of one embodiment of the match flag logic of FIG. 1 including row match circuits and an array match circuit.

FIG. 14 shows match flag logic 1400 that is one embodiment of match flag logic 114 of FIG. 1. Match flag logic 1400 includes row match circuits 1402(0)–1402(Y–1) each associated with corresponding rows of CAM cells 122(0)–122(Y–1), respectively. Each row match circuit receives the match results from each of the match line segments M1–MZ of the corresponding row of CAM cells. In response to the match results on the match line segments and the configuration information, each row match circuit generates a row match signal MR. Each row match signal is indicative of whether one or more row segments (i.e., for ZY×W mode), or one or more groups of row segments (i.e., for ZY/n×nW mode, where n is greater than 1), for a corresponding row stores data that matches the comparand data for a particular configuration. The row match signals MR(0)–MR(Y–1) are then logically combined by array match circuit 1404 to generate MF for the entire array 102. For one embodiment, array match circuit 1404 includes OR logic that logically ORs the states of the row match signals MR0–MR(Y–1).

Figure 15:
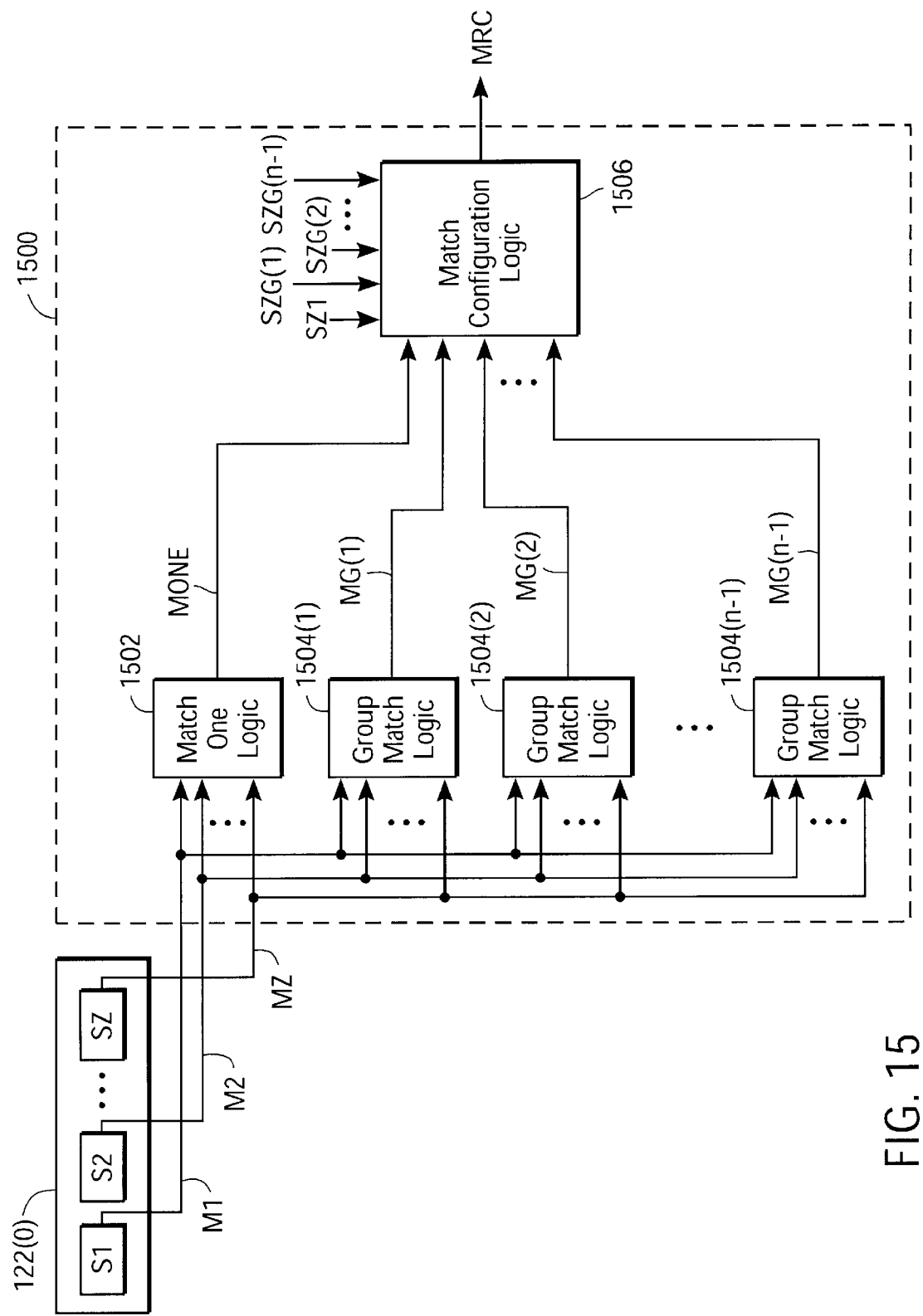
FIG. 15 is a block diagram of one embodiment of the row match circuits of FIG. 14 including match one logic, group match circuits, and match configuration logic.
Figure 16:
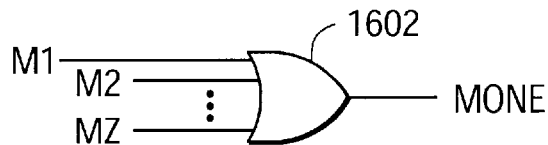
FIG. 16 is a logic diagram of one embodiment of the match one logic of FIG. 15.

FIG. 15 shows row match circuit 1500 that is one embodiment of row match circuit 1402(0) of FIG. 14. Row match circuit 1500 may be used for each row match circuit. Row match circuit 1500 includes match one logic 1502, group match logic circuits 1504(1)–1504(n–1), and match configuration logic 1506. Match one logic 1502 determines a match condition in row 122(0) for the ZY×W mode. Match one logic 1502 receives each of the match line segments M1–MZ from row segments S1–SZ, respectively, and generates MONE indicative of whether any one row segment stores data that matches the comparand data. That is, match one logic 1502 determines when at least one of M1–MZ is enabled. When configuration signal SZ1 is enabled, match configuration logic 1506 outputs MONE as the row match signal MR0. For one embodiment, match one logic 1502 is an OR logic circuit that logically combines the logic states of M1–MZ to generate MONE as shown by OR gate 1602 in FIG. 16.

Figure 17A:
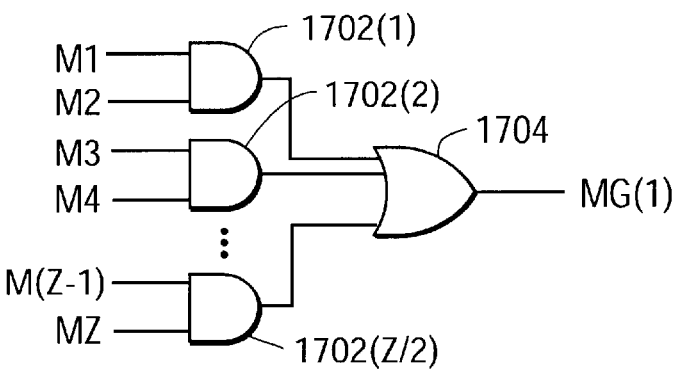
FIGS. 17A–17C are logic diagrams of embodiments of the group match circuits of FIG. 15.

Each group match logic circuit 1504(1)–1504(n–1) determines a match condition within row 122(0) for a different configuration of the CAM system. Each group match logic circuit receives each of the match line segments M1–MZ from row segments S1–SZ, respectively, and logically combines unique groupings of the match line segments to generate group match signals MG(1)–MG(n–1). Each unique grouping corresponds to the number of row segments that are concatenated together to store data for a given configuration of array 102. For one embodiment, there are n–1 groups of row segments, where $n-1=2^x$ and x is an integer from 1 to $\log_2 Z$, and where x is a unique number for each group match circuit. For example, in ZY/2×2W mode, the row segments in array 102 are grouped by pairs. Group match logic circuit 1504(1) determines whether one or more pairs of match line segments M1 and M2, M3 and M4, etc. indicate a match condition. For this first grouping of match line segments, match configuration logic 1506 outputs MG(1) as MR0 when SZG(1) is enabled. One embodiment of group match logic 1504(1) is shown in FIG. 17A and includes Z/2 AND gates 1702(1)–1702(Z/2) each having two inputs coupled to a unique pair of match line segments. The outputs of AND gates 1702 are logically combined by OR gate 1704 to generate MG(1).

Figure 17B:
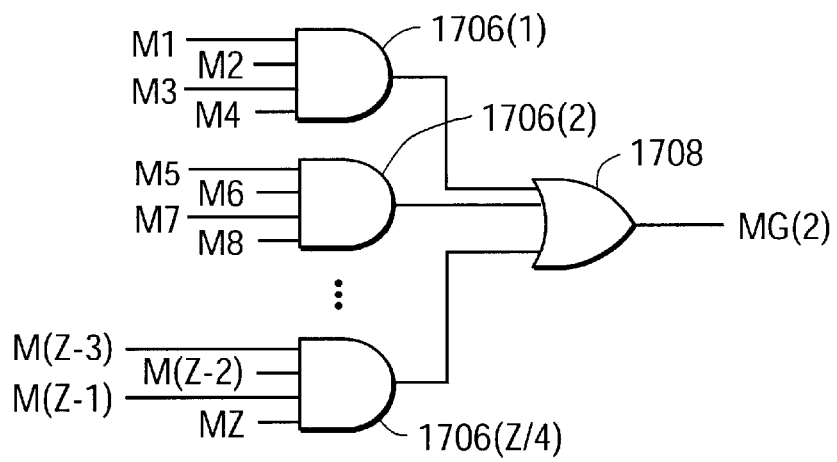

Similarly, in ZY/4×4W mode, the row segments in array 102 are grouped four segments at a time. Group match logic circuit 1504(2) determines whether one or more quartets of match line segments M1–M4, M5–M7, etc. indicate a match condition. For this second grouping of match line segments, match configuration logic 1506 will output MG(2) as MR0 when SZG(2) is enabled. One embodiment of group match logic 1504(2) is shown in FIG. 17B and includes Z/4 AND gates 1706(1)–1706(Z/4) each having four inputs coupled to a unique, consecutive quartet of match line segments. The outputs of AND gates 1706 are logically combined by OR gate 1708 to generate MG(2).

Figure 17C:
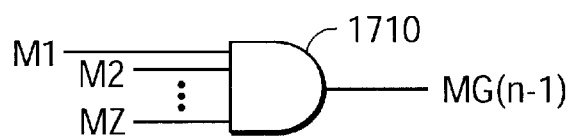

This methodology continues until in Y×ZW mode, the row segments in array 102 are grouped Z segments at a time. Group match logic circuit 1504(n–1) determines whether all of the match line segments M1–MZ for the row of CAM cells indicate a match condition. For this last grouping of match line segments, match configuration logic 1506 will output MG(n−1) as MR0 when SZG(n−1) is enabled. One embodiment of group match logic circuit is shows in FIG. 17C as an AND gate 1710 that combines M1–MZ and generates MG(n−1).

Figure 18:
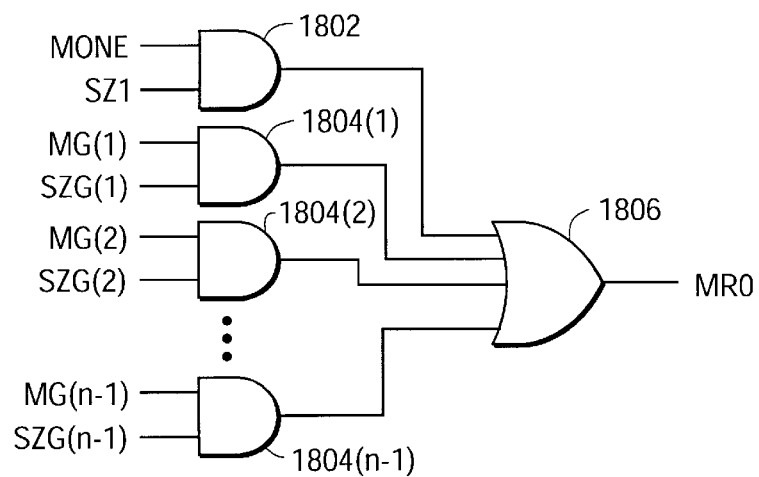
FIG. 18 is a logic diagram of one embodiment of the match configuration logic of FIG. 15.

FIG. 18 shows one embodiment of match configuration logic 1506 of FIG. 15. Other embodiments may be used. For this embodiment, AND gate 1802 determines whether both MONE and SZ1 are enabled, and provides the result to OR gate 1806. AND gates 1804(1)–1804(n−1) determine whether one of the group match signals MG(1)–MG(n−1) and a corresponding configuration signal SZG(1)–SZG(n−1) are enabled, and the results are provided to OR gate 1806. OR gate 1806 provides MR0. For another embodiment, match configuration logic 1506 may be a multiplexer with MONE and MG(1)–MG(n−1) as the inputs, the configuration signals as the select signals, and the row match signal as the output.

Figure 19:
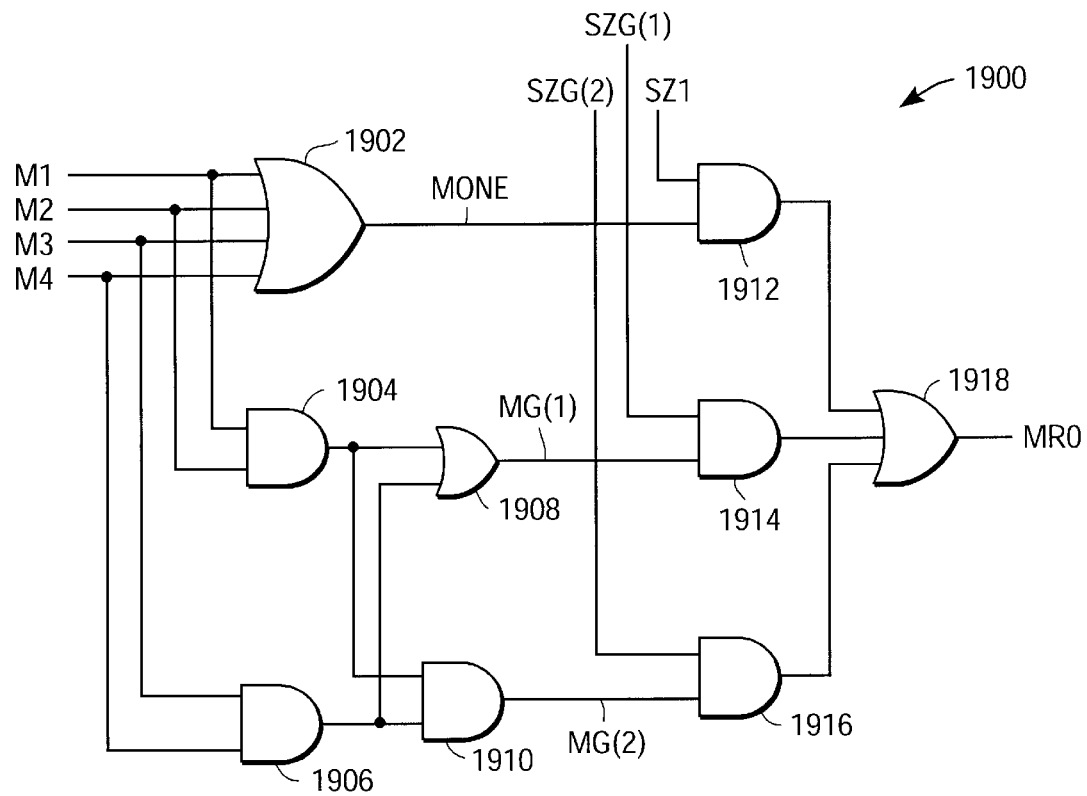
FIG. 19 is a logic diagram of one embodiment of the match flag logic of FIG. 1.

FIG. 19 shows row match circuit 1900 that is one embodiment of row match circuit 1500 of FIG. 15 for a CAM system having Z=4 row segments and four corresponding match line segments M1–M4. The match one logic is represented by OR gate 1902 that logically ORs each of the logic states of M1–M4 to generate MONE. This embodiment has two group match logic circuits. The first includes AND gates 1904 and 1906, and OR gate 1908. The second includes AND gates 1904, 1906, and 1910. AND gate 1904 is connected to M1 and M2, and AND gate 1906 is connected to M3 and M4. OR gate 1908 generates MG(1) by combining the outputs of AND gates 1904 and 1906, and AND gate 1910 generates MG(2) by combining the outputs of AND 1904 and 1906. The match configuration logic includes AND gates 1912, 1914, and 1916, and OR gate 1918. AND gates 1912, 1914, and 1916 logically combine SZ1 with MONE, SZG(1) with MG(1), and SZG(2) with MG(2), respectively, to provide inputs for OR gate 1918. OR gate 1918 provides MR0. Other embodiments may be used.

Figure 20:
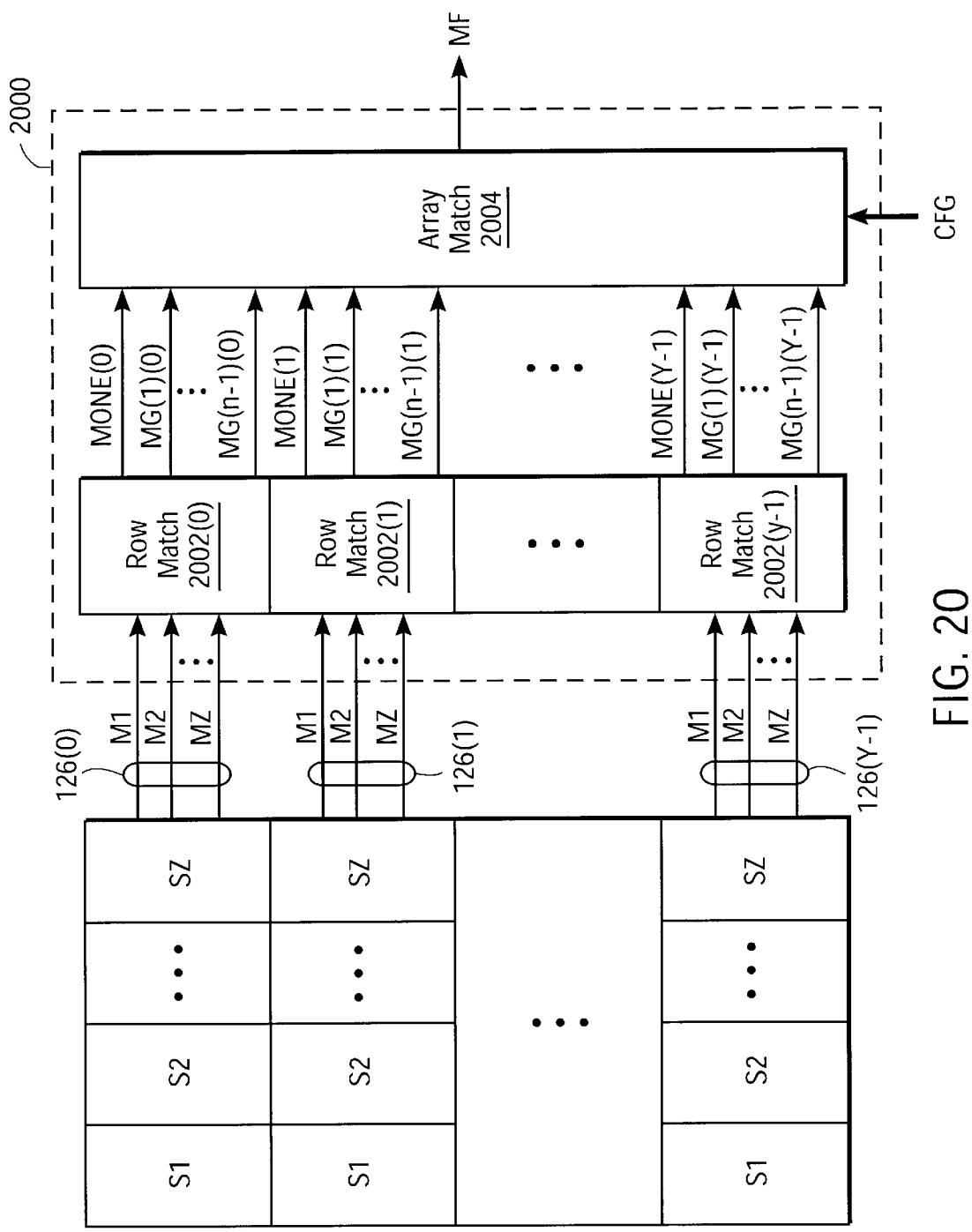
FIG. 20 is a block diagram of another embodiment of the match flag logic of FIG. 1 including row match circuits and an array match circuit.

FIG. 20 shows match flag logic 2000 that is another embodiment of match flag logic 114 of FIG. 1. Match flag logic 2000 includes row match circuits 2002(0)–2002(Y−1) associated with corresponding rows of CAM cells 122(0)–122(Y−1), respectively. Each row match circuit 2002 includes the match one logic 1502 and group match logic circuits 1504(1)–1504(n−1) of FIG. 15, but excludes the match configuration logic 1506. Instead, MONE and the group match signals from each row match circuit are provided to array match circuit 2004. Array match 2004 also receives the configuration information CFG and determines whether one or more row segments, or one or more groups of row segments, stores data that matches the comparand data for a particular configuration.

Figure 21:
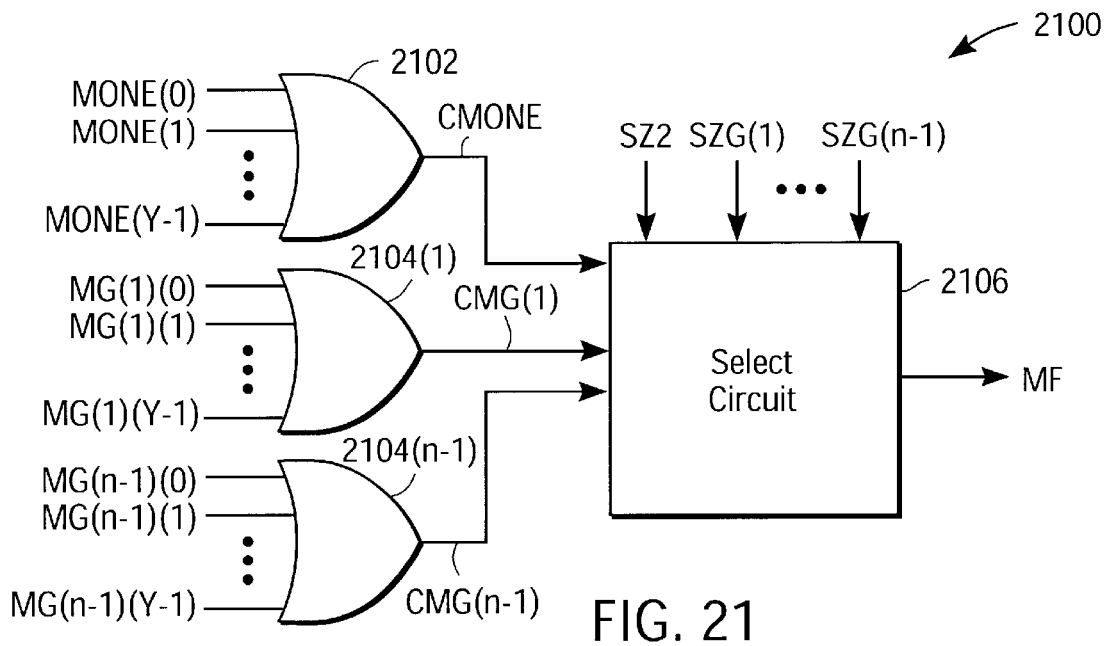
FIG. 21 is a block diagram of one embodiment of the array match circuit of FIG. 20 including OR logic and a select circuit.

FIG. 21 shows array match circuit 2100 that is one embodiment of array match circuit 2004 of FIG. 20. Array match circuit 2100 includes n OR logic circuits 2102 and 2104(1)–2104(n−1), and select circuit 2106. The n OR logic circuits generate n composite signals indicative of the match conditions for the possible configurations of array 102. OR circuit 2102 logically combines the MONE signals MONE(0)–MONE(Y−1) from each row match circuit 2002(0)–2002(Y−1) to generate a composite signal CMONE. CMONE indicates a match condition for the ZY×W mode when any one row segment stores data that matches the comparand data. That is, OR circuit 2102 determines when at least one of M1–MZ from any of the CAM rows is enabled. Select logic 2106 outputs CMONE as MF when configuration signal SZ1 is enabled.

Each OR circuit 2104(1)–2104(n−1) determines a match condition for a different configuration of the CAM system. Each OR circuit 2104 logically combines the corresponding group match signals from each row match circuit 2002 to generate a composite group match signal CMG. For example, OR circuit 2104(1) combines MG(1)(0)–MG(1)(Y−1) to generate CMG(1) that indicates a match condition for a first grouping of row segments in ZY/2×2W mode, OR gate 2104(2) combines MG(2)(0)–MG(2)(Y−1) to generate CMG(2) that indicates a match condition for a second grouping of row segments in ZY/4×4W mode, and OR gate 2104(n−1) combines MG(n−1)(0)–MG(n−1)(Y−1) to generate CMG(n−1) that indicates a match condition for a grouping of Z row segments in Y×ZW mode. One of the composite group match signals is provided as MF by select logic 2106 in response to the corresponding configuration signal SZG(1)–SZG(n−1).

Figure 22:
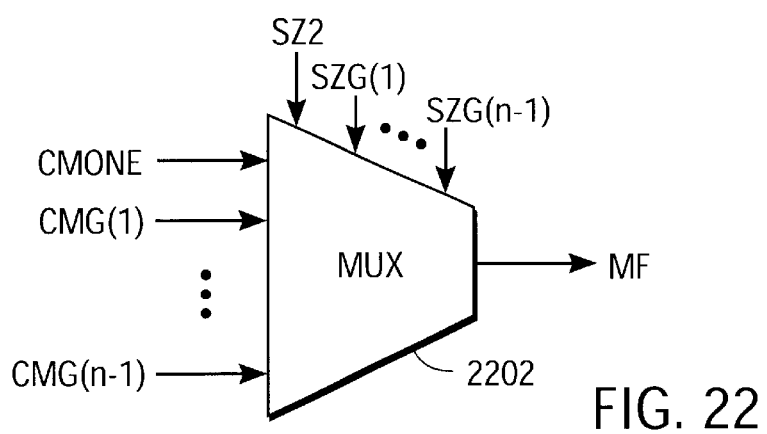
FIG. 22 is a logic diagram of one embodiment of the select logic of FIG. 21.

FIG. 22 shows one embodiment of select circuit 2106. For this embodiment, the select circuit is a multiplexer 2202 with CMONE and CMG(1)–CMG(n−1) connected to its input ports, the configuration signals used as the select signals, and MF connected to its output port.

Figure 23:
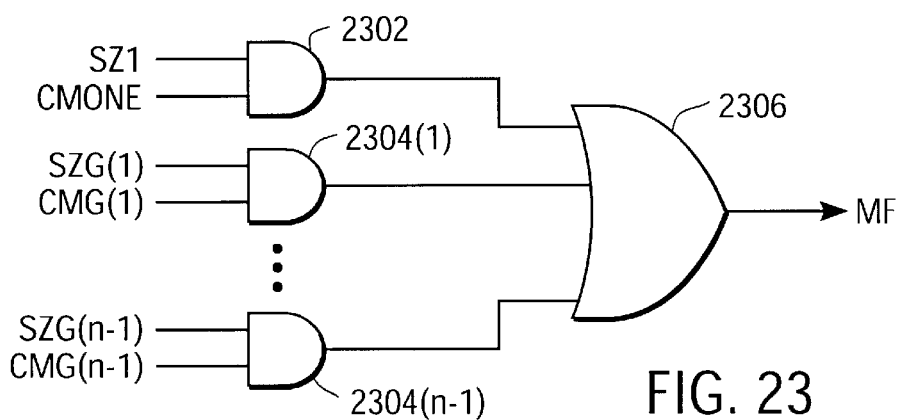
FIG. 23 is a logic diagram of another embodiment of the select logic of FIG. 21.

FIG. 23 shows another embodiment of select circuit 2106. For this embodiment, AND gate 2302 logically combines SZ1 and CMONE and provides the result to an input of OR Gate 2306. AND gates 2304(1)–2304(n−1) determine whether one of the composite group match signals CMG(1)–CMG(n−1) and a corresponding configuration signals SZG(1)–SZG(n−1) are enabled, and the results are provided to OR gate 2306. OR gate 2306 provides MF.

Figure 24:
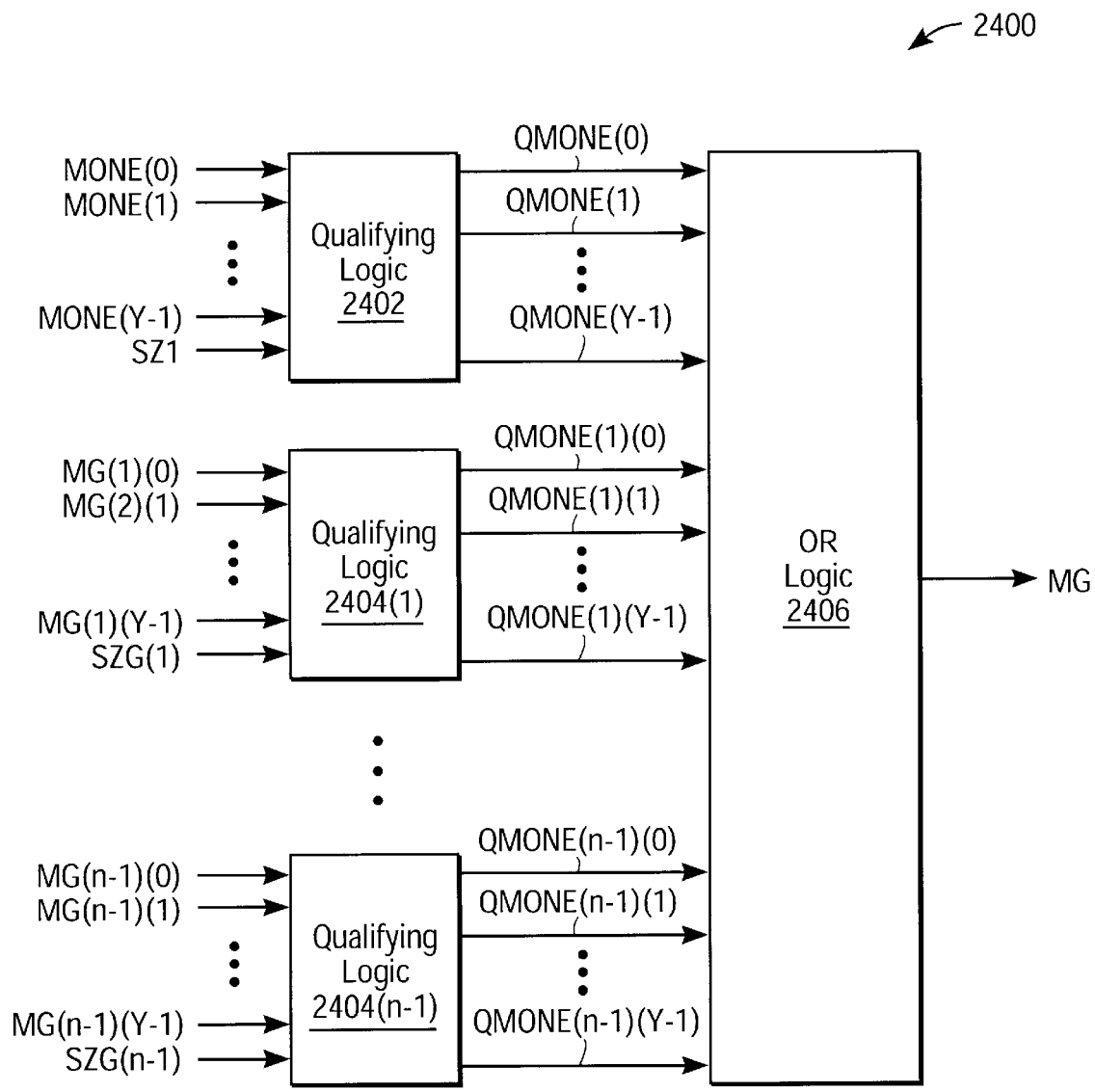
FIG. 24 is a block diagram of another embodiment of the array match circuit of FIG. 20 including qualifying logic circuits and OR logic.

FIG. 24 shows array match circuit 2400 that is another embodiment of array match circuit 2004 of FIG. 20. Array match circuit 2400 includes n qualifying logic circuits 2402 and 2404(1)–2404(n−1), and OR logic 2406. The n qualifying logic circuits generate n qualified signals that each indicate match conditions for within a row of CAM cells for the possible configurations of array 102. Qualifying logic 2402 logically combines the MONE signals MONE(0)–MONE(Y−1) from each row match circuit 2002(0)–2002(Y−1), and qualifies the results with configuration signal SZ1 to generate qualified MONE signals QMONE(0)–QMONE(Y−1). One or more of the QMONE signals are enabled only when there is a match condition in a row segment for the ZY×W mode and SZ1 is enabled. If one of QMONE is enabled, select logic 2406 enables MF.

Each qualifying logic circuit 2404(1)–2404(n−1) determines a match condition for a different configuration of the CAM system. Each qualifying logic circuit 2404 logically combines the corresponding group match signals from each row match circuit 2402, and qualifies the results with corresponding group configuration signals to generate qualified group match signals QCMG. For example, qualifying logic 2404(1) combines MG(1)(0)–MG(1)(Y−1) with SZG(1) to generate QCMG(1)(0)–QCMG(1)(Y−1) that each indicate a match condition in a row of CAM cells for a first grouping of row segments only if SZG(1) is enabled (i.e., in the ZY/2×2W mode); qualifying logic 2404(2) combines MG(2)(0)–MG(2)(Y−1) with SZG(2) to generate QCMG(2)(0)–QCMG(2)(Y−1) that each indicate a match condition in a row of CAM cells for a second grouping of row segments only if SZG(2) is enabled (i.e., in the ZY/4×4W mode); and qualifying logic 2404(n−1) combines MG(n−1)(0)–MG(n−1)(Y−1) with SZG(n−1) to generate QCMG(n−1)(0)–QCMG(n−1)(Y−1) that each indicate a match condition for a grouping of Z row segments in the Y×ZW mode. If one of qualified group match signals is enabled, select logic 2406 enables MF.

Figure 25:
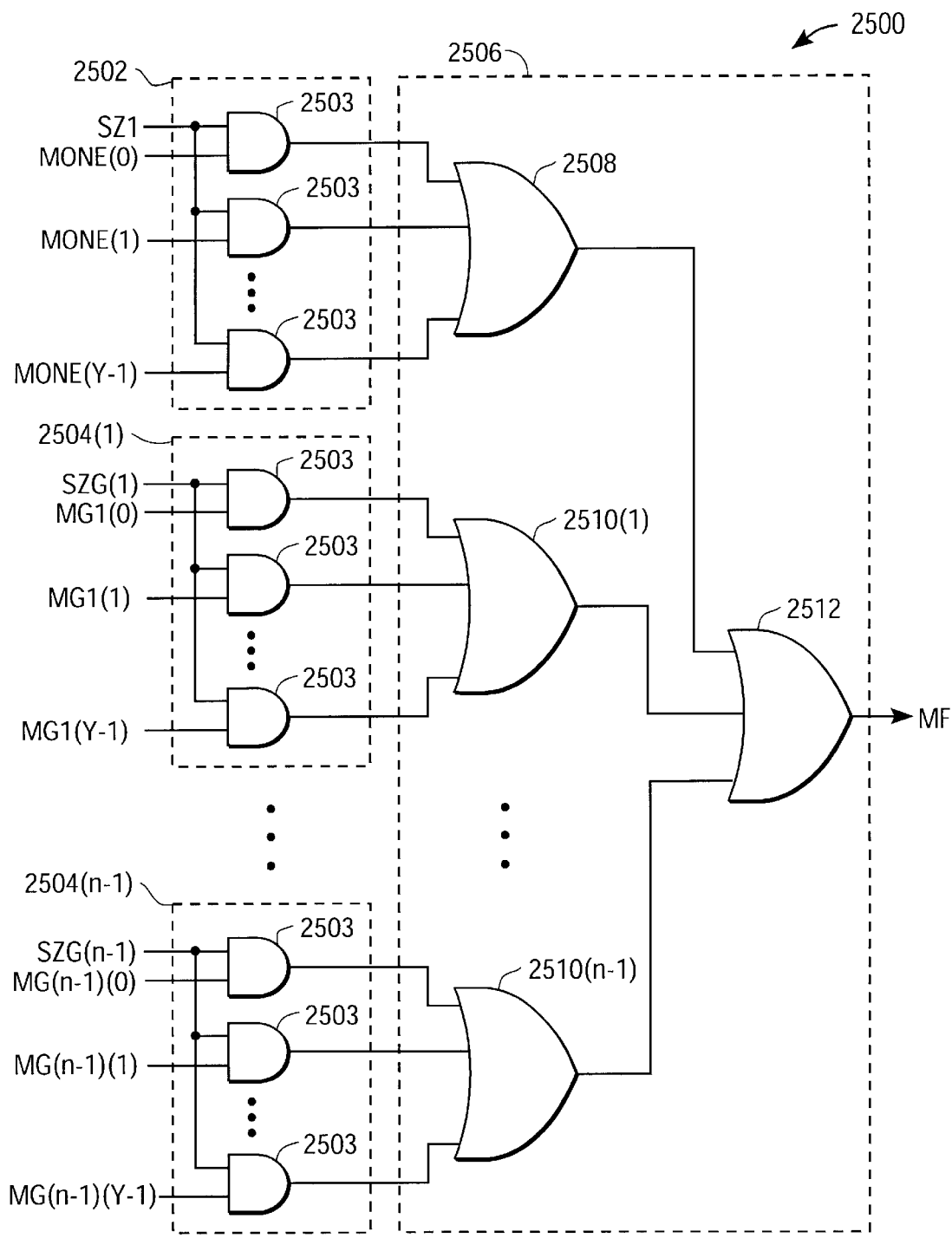
FIG. 25 is a logic diagram of one embodiment of the qualifying logic circuits and the OR logic of FIG. 24.

FIG. 25 shows match array logic 2500 that is one embodiment of match array logic 2400 of FIG. 24. Other embodiments may be used. Match array logic includes qualifying logic circuits 2502 and 2504(1)–2504(n–1) and OR logic 2506. Qualifying logic circuits 2502 and 2504(1)–2504(n–1) are embodiments of logic circuits 2402 and 2404(1)–2404(n–1), respectively. Each of the qualifying logic circuits includes Y two-input AND gates that each logically AND the corresponding configuration signal with each of the MONE or group match signals. The outputs of the Y AND gates for qualifying logic 2502 are provided to OR gate 2508, and the outputs of the Y AND gates for qualifying logic circuits 2504(1)–2504(n–1) are provided to OR gates 2510(1)–2510(n–1), respectively. The outputs of the OR gates are provided to OR gate 2512 to generate MF.

Multiple Match Flag

With reference again to FIG. 1, multiple match flag logic 116 monitors the match results on the match line segments 126(0)–126(Y–1), and enables a multiple match flag MMF when comparand data matches data stored in more than one of the row segments in array 102 in ZY×W mode (as indicated by the configuration information), or when comparand data matches data stored in more than one group of row segments in array 102 in other configurations.

Figure 26:
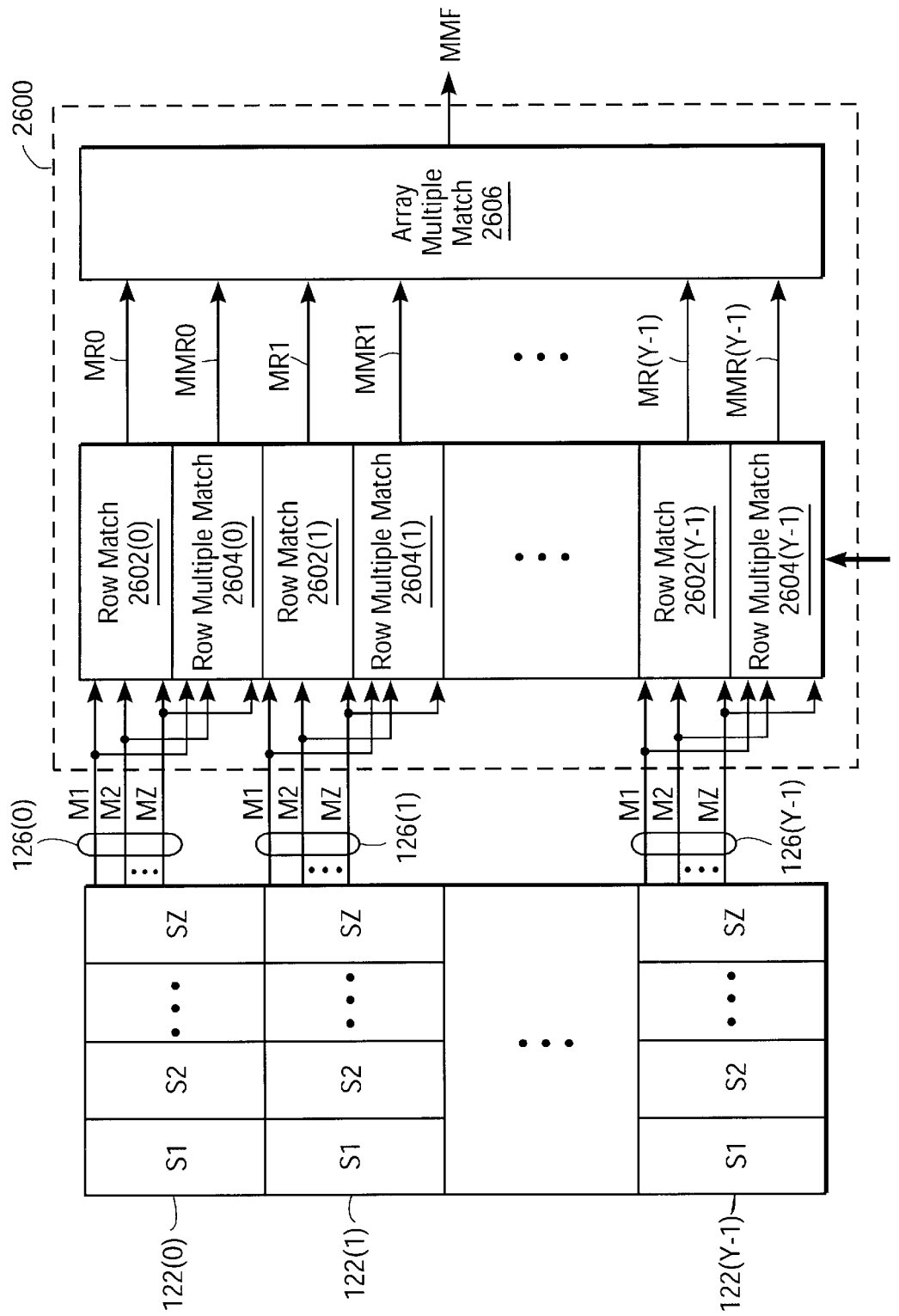
FIG. 26 is a block diagram of one embodiment of the multiple match flag logic of FIG. 1 including row match circuits, row multiple match circuits, and an array multiple match circuit.

FIG. 26 shows multiple match flag logic 2600 that is one embodiment of multiple match flag logic 116 of FIG. 1. Multiple match flag logic 2600 includes a row match circuit 2602 and a row multiple match circuit 2604 for each corresponding row of CAM cells 122.

Each row mach circuit 2602 may be the same row match circuit 1402 of FIG. 14 that receives the match results from each of the match line segments M1–MZ of a corresponding row of CAM cells and, in response to the configuration information, generates a row match signal MR. Each row match signal is indicative of whether one or more row segments (i.e., for ZY×W mode), or one or more groups of row segments (i.e., for ZY/n×nW mode, where n is greater than 1), for a corresponding row stores data that matches the comparand data for a particular configuration. Array multiple match circuit 2606 monitors the match results of the row match signals, and enables MMF when there is a match in more than row segment, or more than one group of row segments, in different rows of CAM cells for a given configuration.

Each row multiple match circuit 2604 receives the match results from each of the match line segments M1–MZ of a corresponding row of CAM cells and, in response to the configuration information, generates a row multiple match signal MMR. Each row multiple match signal is indicative of whether more than one row segment (i.e., for ZY×W mode), or more than one groups of row segments (i.e., for ZY/n×nW mode, where 1<n<Z), of the corresponding row stores data that matches the comparand data for a particular configuration. Array multiple match circuit 2606 monitors the match results of the row multiple match signals and enables MMF when at least one of the row multiple match signals is enabled for a given configuration.

Figure 27:
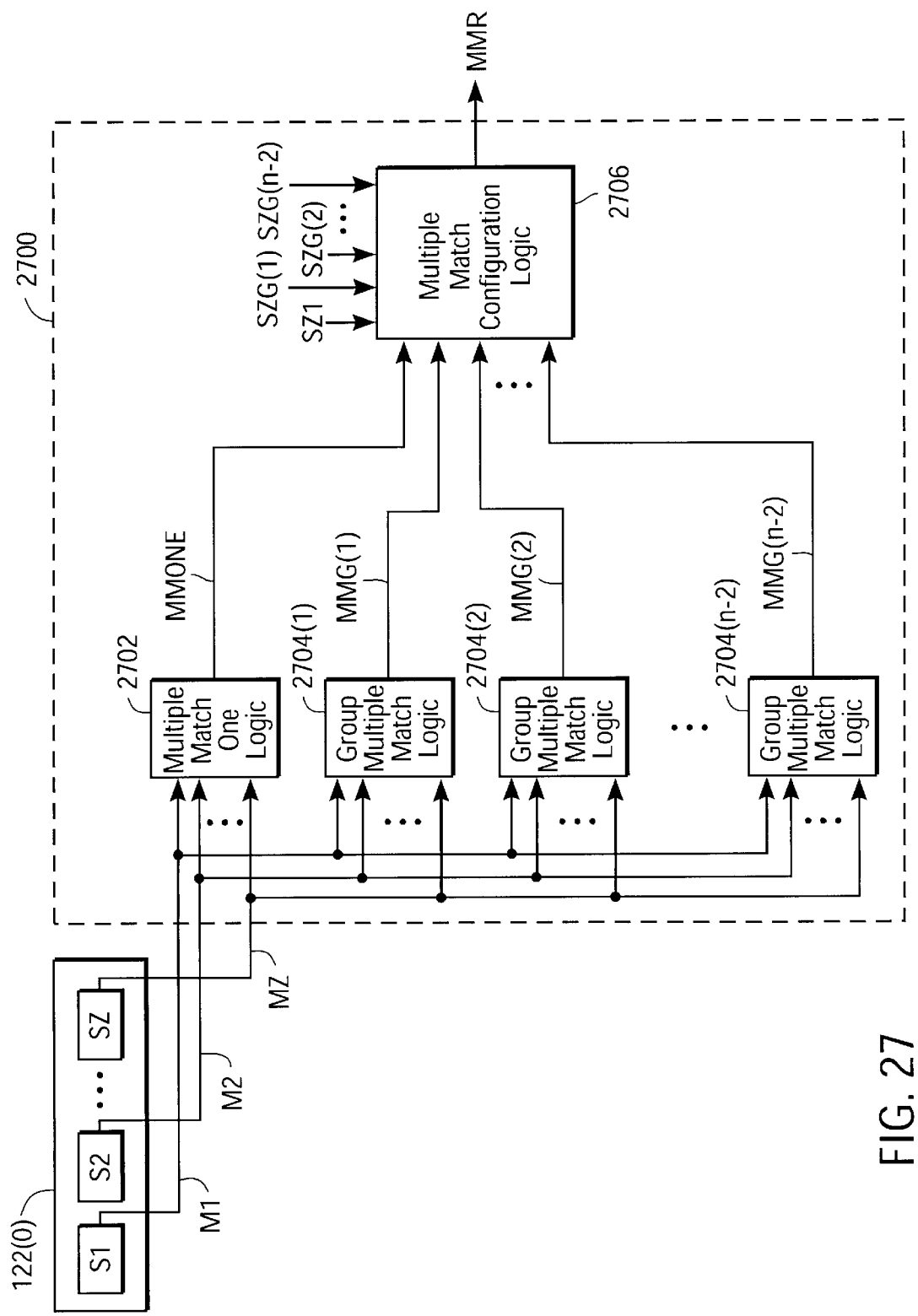
FIG. 27 is a block diagram of one embodiment of a row multiple match circuit of FIG. 26 including multiple match one logic, group multiple match logic circuits, and a multiple match configuration logic circuit.
Figure 28:
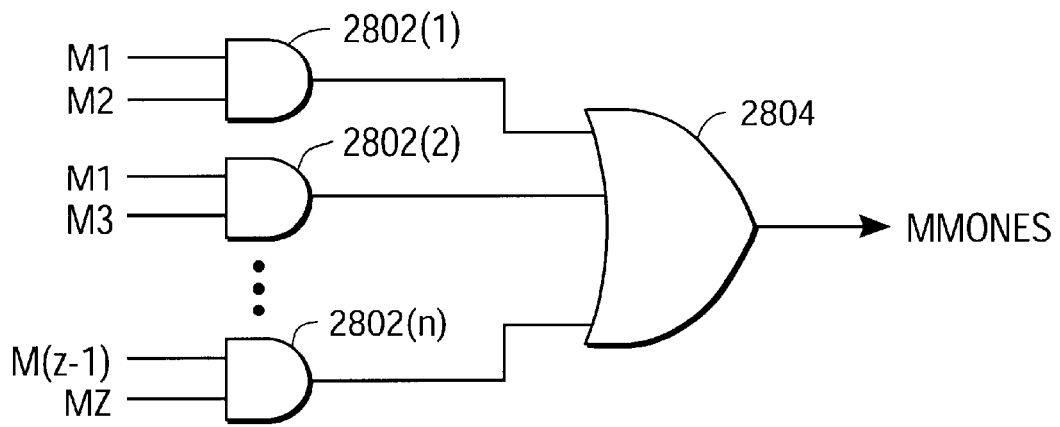
FIG. 28 is a logic diagram of one embodiment of the multiple match one logic of FIG. 27.
Figure 29:
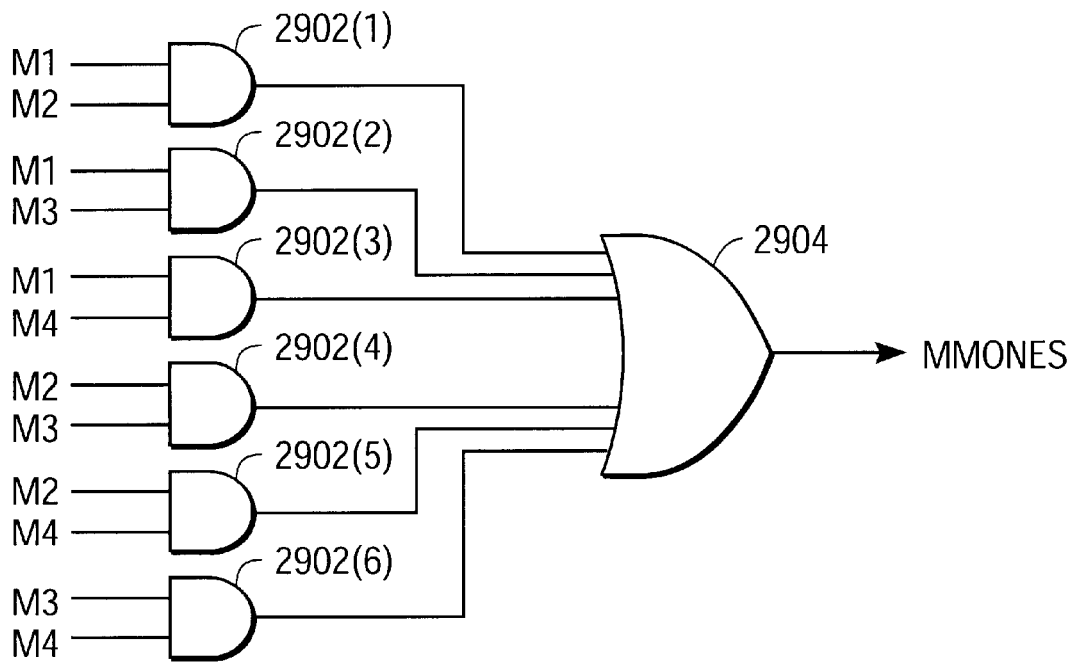
FIG. 29 is a logic diagram of one embodiment of the multiple match one logic of FIG. 28 for four row segments.

FIG. 27 shows row match circuit 2700 that is one embodiment of row multiple match circuit 2604(0) of FIG. 26. Row match circuit 2700 may be used for each row multiple match circuit. Row multiple match circuit 2700 includes multiple match one logic 2702, group multiple match logic circuits 2704(1)–2704(n–2), and multiple match configuration logic 2706. Multiple match one logic 2702 determines a multiple match condition in row 122(0) for the ZY×W mode. Multiple match one logic 2702 receives each of the match line segments M1–MZ from row segments S1–SZ, respectively, and generates MMONE indicative of whether more than one row segment stores data that matches the comparand data. That is, multiple match one logic 2702 determines when two or more of M1–MZ are enabled. When configuration signal SZ1 is enabled, match configuration logic 2706 outputs MMONE as the row multiple match signal MMR0. Any multiple match logic circuitry can be used for logic 2702 to determine a multiple match condition. One embodiment of multiple match one logic is shown in FIG. 28. For this embodiment, r two-input AND gates each receive a unique combination of two of the match line segments, where r is determined by the combinatorial formula $r=Z!/(2!(Z-2)!)$. The output of each AND gate is provided to OR gate 2802 to generate MMONES. One example of the approach of FIG. 28 for four row segments is shown in FIG. 29, where all of the combinations of the four match lines segments taken two at a time are provided to AND gates 2902(1)–2902(6), and the outputs of the AND gates are provided to OR gate 2904.

Figure 30A:
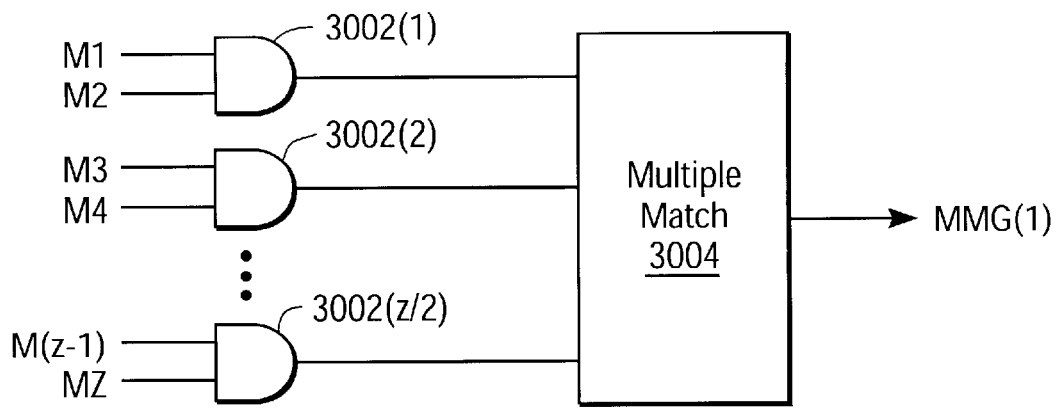
FIGS. 30A–30C are logic diagrams of embodiments of the group multiple match logic circuits of FIG. 27.

Each group multiple match logic circuit 2704(1)–2704(n–2) determines a multiple match condition within row 122(0) for a different configuration of the CAM system. Each group multiple match logic circuit receives each of the match line segments M1–MZ from row segments S1–SZ, respectively, and logically combines unique groupings of the match line segments to generate group multiple match signals MMG(1)–MMG(n–2). Each unique grouping corresponds to the number of row segments that are concatenated together to store data for a given configuration of array 102. For one embodiment, there are n–2 groups of row segments, where $n-2=2^x$ and x is an integer from 1 to $\log_2 Z$, and where x is a unique number for each group multiple match circuit. For example, in ZY/2×2W mode, the row segments in array 102 are grouped by pairs. Group multiple match logic circuit 2704(1) determines whether more than one of the pairs of match line segments M1 and M2, M3 and M4, etc. indicate a match condition. For this first grouping of match line segments, multiple match configuration logic 2706 outputs MMG(1) as MMR0 when SZG(1) is enabled. One embodiment of multiple match logic 2704(1) is shown in FIG. 30A and includes Z/2 AND gates 3002(1)–3002(Z/2) each having two inputs coupled to a unique, consecutive pair of match line segments. The outputs of AND gates 3002 are provided to multiple match logic 3004 to generate MMG(1). Logic 3304 may be any multiple match logic circuit.

Figure 30B:
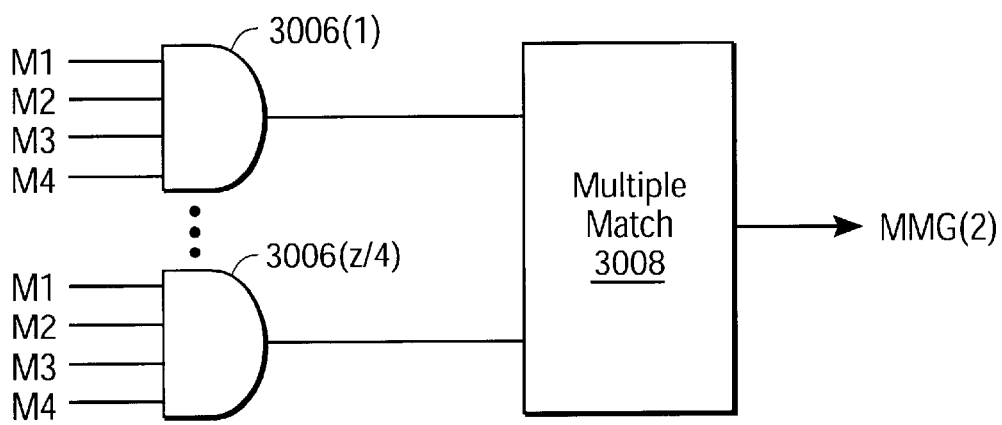

Similarly, in ZY/4×4W mode, the row segments in array 102 are grouped in four segments at a time. Group multiple match logic circuit 2704(2) determines whether more than one quartet of match line segments M1–M4, M5–M7, etc. indicate a match condition. For this second grouping of match line segments, multiple match configuration logic 2706 outputs MMG(2) as MMR0 when SZG(2) is enabled. One embodiment of multiple match logic 2704(2) is shown in FIG. 30B and includes Z/4 AND gates 3006(1)–3006(Z/4) each having four inputs coupled to a unique, consecutive quartet of match line segments. The outputs of AND gates 3006 are provided to multiple match logic 3008 to generate MMG(2). Logic 3308 may be any multiple match logic circuit.

This methodology continues until in ZY/(Z–1)×(Z–1)W mode, the row segments in array 102 are grouped Z/2 segments at a time. Group multiple match logic circuit 2704(n–2) determines whether both of the Z/2 groupings of match line segments M1–M(Z/2) and M(Z/2+1)–MZ indicate a match condition. For this grouping of match line segments, multiple match configuration logic 2706 will output MMG(n–2) as MMR0 when SZG(n–2) is enabled.

Figure 30C:
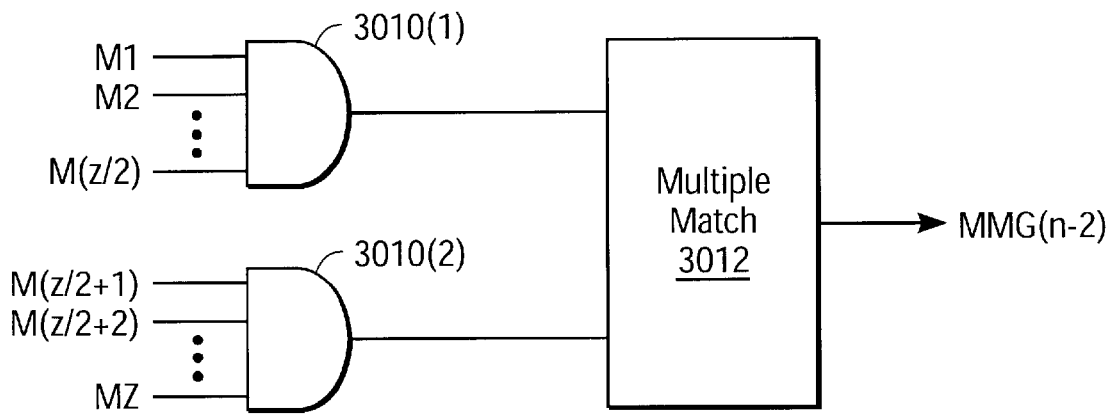

One embodiment of multiple match logic 2704(n−2) is shown in FIG. 30C and includes two AND logic circuits 3010(1) and 3010(2) each having Z/2 inputs coupled to a unique, consecutive grouping of Z/2 match line segments. The outputs of AND gates 3010 are provided to multiple match logic 3012 to generate MMG(n−2). Logic 3012 may be any multiple match logic circuit. For one embodiment, multiple match logic 3012 may be AND logic that logically ANDs the outputs of AND gates 3010.

The final grouping of row segments in which all row segments are grouped for a given row (i.e., Y×ZW mode) is taken care of by the row match circuits (as will be described below), and does not require a separate group multiple match logic circuit.

Figure 31:
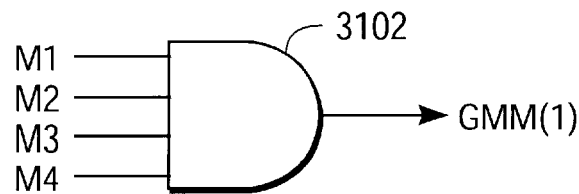
FIG. 31 is a logic diagram of one embodiment of one of the group multiple match circuits for four row segments.

FIG. 31 shows one embodiment of the group multiple match circuits for a row of CAM cells having Z=4 row segments. For this embodiment, only one group multiple match circuit may be used to determine when comparand data matches data stored in group S1–S2 (indicated on M1 and M2) and data stored in group S3–S4 (indicated on M3 and M4). Thus, a single AND logic circuit 3102 may be used to logically AND the logic states of M1–M4 to generate a single group multiple match signal GMM(1) for row 122(0).

Figure 32:
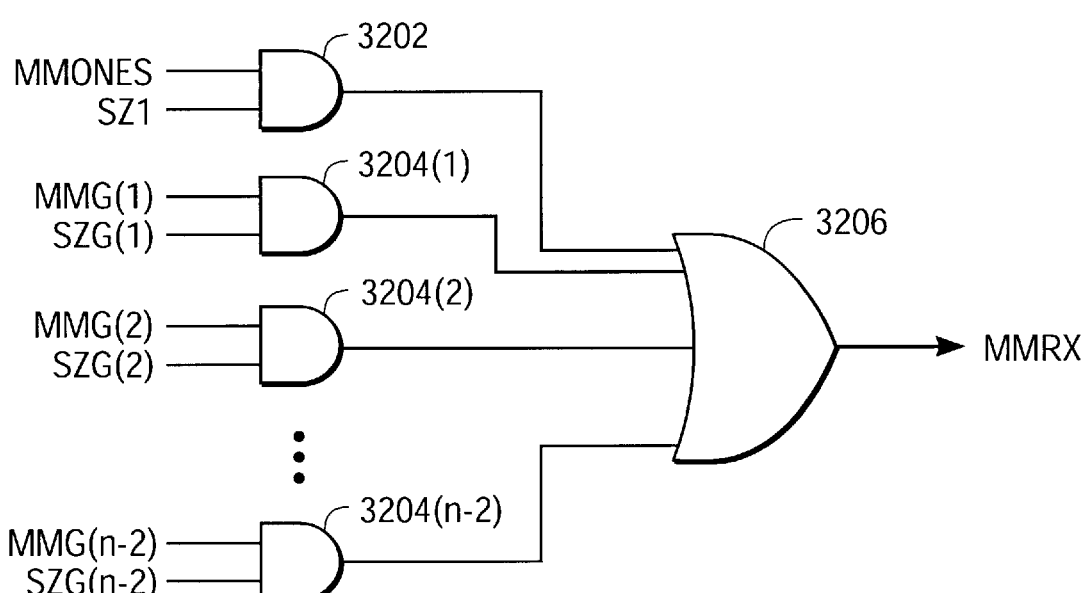
FIG. 32 is a logic diagram of one embodiment of the multiple match configuration logic of FIG. 27.

FIG. 32 shows one embodiment of multiple match configuration logic 2706 of FIG. 27. Other embodiments may be used. For this embodiment, AND gate 3202 determines whether both MMONE and SZ1 are enabled and provides the result to OR gate 3206. AND gates 3204(1)–3204(n−2) determine whether one of the group multiple match signals MMG(1)(1)–MMG(n−2) and a corresponding configuration signal SZG(1)–SZG(n−2) are enabled, and the results are provided to OR gate 3206. OR gate 3206 provides MMR0. For another embodiment, multiple match configuration logic 2706 may be multiplexer with MMONE and MMG(1)–MMG(n−2) as the inputs, the configuration signals as the select signals, and the row match signal as the output.

Figure 33:
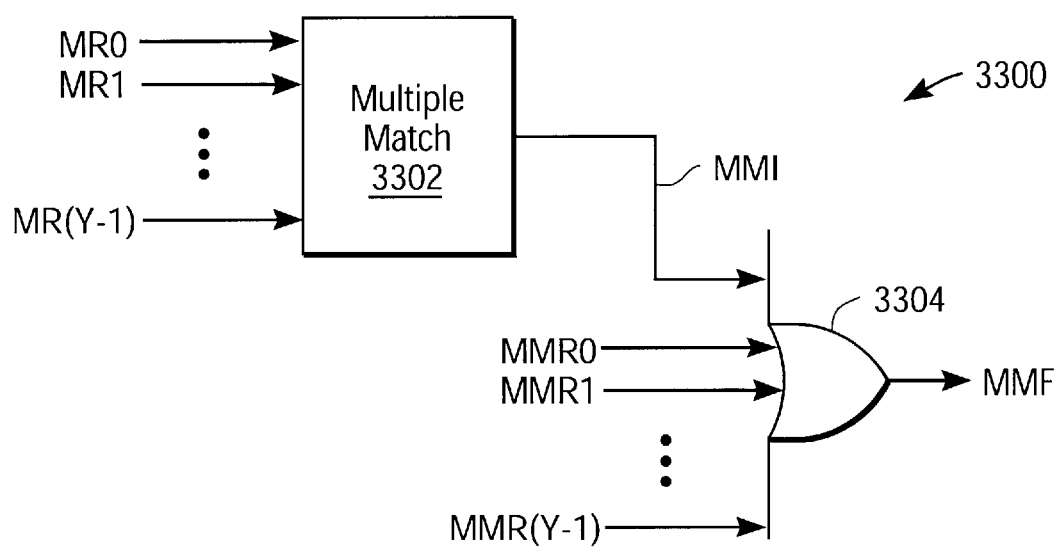
FIG. 33 is a block diagram of one embodiment of the array multiple match circuit of FIG. 26.

FIG. 33 shows array multiple match logic 3300 that is one embodiment of array multiple match logic 2606 of FIG. 26. Logic 3300 includes multiple match logic 3302 that receives the row match signals MR0–MR(Y−1), and generates an inter-row multiple match signal MMI when there is a match in more than one row segment, or more than one group of row segments, in different rows of CAM cells for a given configuration. MMI is provided to one input of OR logic 3304. OR logic 3304 also receives the row multiple match signals MMR0–MMR(Y−1) to enable MMF when there is a match in more than one row segment, or more than one group of row segments, within a row of CAM cells for a given configuration.

Match Address/Index

With reference again to FIG. 1, priority encoder logic 112 monitors the match results on the match line segments 126(0)–126(Y−1) of each CAM row, and determines a match address or index MA that is the address of the highest priority row segment or group of row segments (depending on the configuration information) that stores data that matches the comparand data. The highest priority address may be the lowest numerical address, the highest numerical address, or any other predetermined priority.

Figure 34:
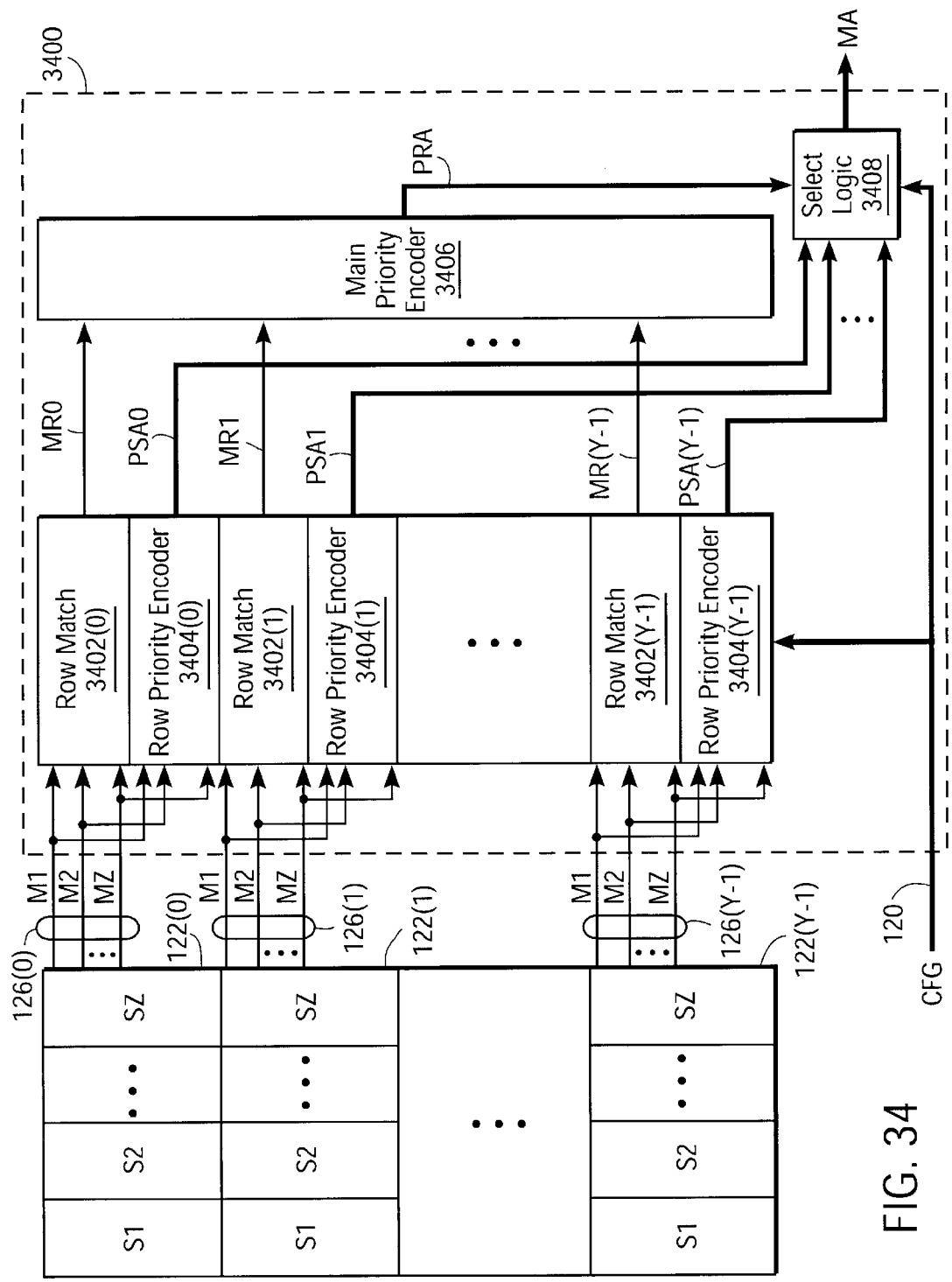
FIG. 34 is a block diagram of the configurable CAM system of FIG. 1 including one embodiment of the priority encoder logic having row match circuits, row priority encoder circuits, a main priority encoder, and select logic.

FIG. 34 shows priority encoder logic 3400 that is one embodiment of priority encoder logic 112 of FIG. 1. Priority encoder logic 3400 includes a row match circuit 3402 and a row priority encoder 3404 for each corresponding row of CAM cells 122. Each row mach circuit may be the same row match circuit 1402 of FIG. 14 that receives the match results from each of the match line segments M1–MZ of a corresponding row of CAM cells and, in response to the con- figuration information, generates a row match signal MR. Main priority encoder 3406 monitors the match results reflected on the Y row match signals MR(0)–MR(Y−1)and generates a row match address PRA that has $\log_2$ Y address bits. The row address corresponds to the address of the highest priority row of CAM cells 122 that has a row segment or a group of row segments that stores data that matches the comparand data for a given configuration.

Each row priority encoder receives the match results from each of the match line segments M1–MZ of a corresponding row of CAM cells and, in response to the configuration information, generates a segment address PSA that that corresponds to the address of the row segment or a group of row segments within a particular row of CAM cells that stores data that matches the comparand data for a given configuration. The row address PRA and the segment addresses PSA(0)–PSA(Y−1) are provided to select logic 3408 to generate the match address in response to the configuration information.

Figures 35, 36:
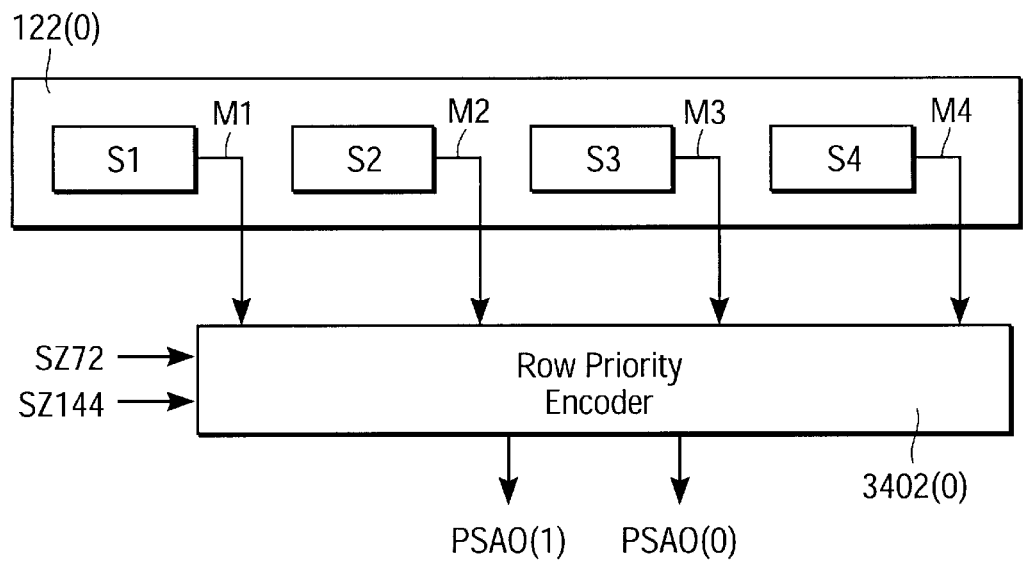
FIG. 35 is a block diagram of one of the row priority encoder circuits for particular configurations of the CAM system.
FIG. 36 is one embodiment of a truth table for one operating configuration for the row priority encoder circuit of FIG. 35.

For one embodiment, each segment address has $\log_2$ Z address bits that may reflect different values depending on the configuration of the corresponding row (and array 102). For example, FIG. 35 shows row priority encoder 3402(0) for an embodiment where W=72 and Z=4. For this example, row priority encoder 3402(2) outputs segment address bits PSA0(1) and PSA0(0) in response to the match results on match line segments M1–M4 and configuration signals SZ72 and SZ144 indicative of two configurations for row 122(0); namely, a ×72 bit mode and a ×144 bits mode. A ×288 bit mode which utilizes all of the row segments as one entire group does not need a separate configuration signal as the segment address outputs will be ignored and the row address PRA will reflect the match address MA. In the ×72 mode, SZ72 is enabled and each row segment S1–SZ is uniquely addressable such that S1 has address 0, S2 has address 1, S3 has address 2, and S4 has address 3. FIG. 36 shows one embodiment of the truth table implemented by row priority encoder 3402(0) for the ×72 mode. In the ×144 mode, SZ144 is enabled and each group of two segments S1–S2 and S3–S4 is uniquely addressable such that S1–S2 has address 0 and S3–S4 has address 1. FIG. 37 shows one embodiment of the truth table implemented by row priority encoder 3402(0) for the ×144 mode in which PSA0(1) is used to reflect the address of each group of row segments, and PSA0(0) is ignored. For other embodiments, PSA0(0) may be used to reflect the address of each group of row segments. Other truth tables may be used for FIGS. 36 and 37 (and corresponding logic generated accordingly) including those that logically complement one of more or the signals indicated in the truth tables.

Any logic or circuitry may be used to implement the truth tables of FIGS. 36 and 37. FIG. 38 shows logic 3800 that is one embodiment of generating PSA0(0) for a logic zero state. Other embodiments may be used to generate PSA0(1) for a logic one state. Logic 3800 includes NAND gates 3806 and 3808 and inverters 3802 and 3804. NAND gate 3808 has one input coupled M3 and the other input coupled to the logical complement of M2 via inverter 3804. NAND gate 3806 has one input coupled to the output of NAND gate 3808, and the other input coupled to the logical complement of M1 via inverter 3802. The output of NAND gate 3806 provides SA0(0).

FIG. 39 shows logic 3900 that is one embodiment of generating PSA0(1). Other embodiment may be used. Logic 3900 includes NAND gates 3902, 3904, 3906, and 3910, and NOR gate 3908. NAND gate 3902 has one input coupled to M1 and another input coupled to M2. NAND gate 3904 has one input coupled to the output of NAND gate 3904 and another input coupled to SZ144. NAND gate 3906 has one input coupled to the output of NAND gate 3906 and the other input coupled to the output of NAND gate 3910. NAND gate 3910 has one input coupled to SZ72 and the other input coupled to the output of NOR gate 3908. NOR gate 3908 has one input coupled to M1 and the other input coupled to M2.

As indicated above, the row address and the segment addresses PSA(0)–PSA(Y-1) are provided to select logic 3408. In response to the row address PRA and the configuration information on bus 120, select logic 3408 selects one of the segment addresses associated with the row of CAM cells at row address PRA to generate the highest priority match address MA for the entire array 102. In Y×ZW mode, the row address alone indicates the highest priority address with a matching entry, and select logic 3408 provides PRA as MA. In other configurations, select logic 3408 outputs the row address as the most significant bits of MA, and the corresponding segment address as the least significant bit(s) of MA.

Figure 40:
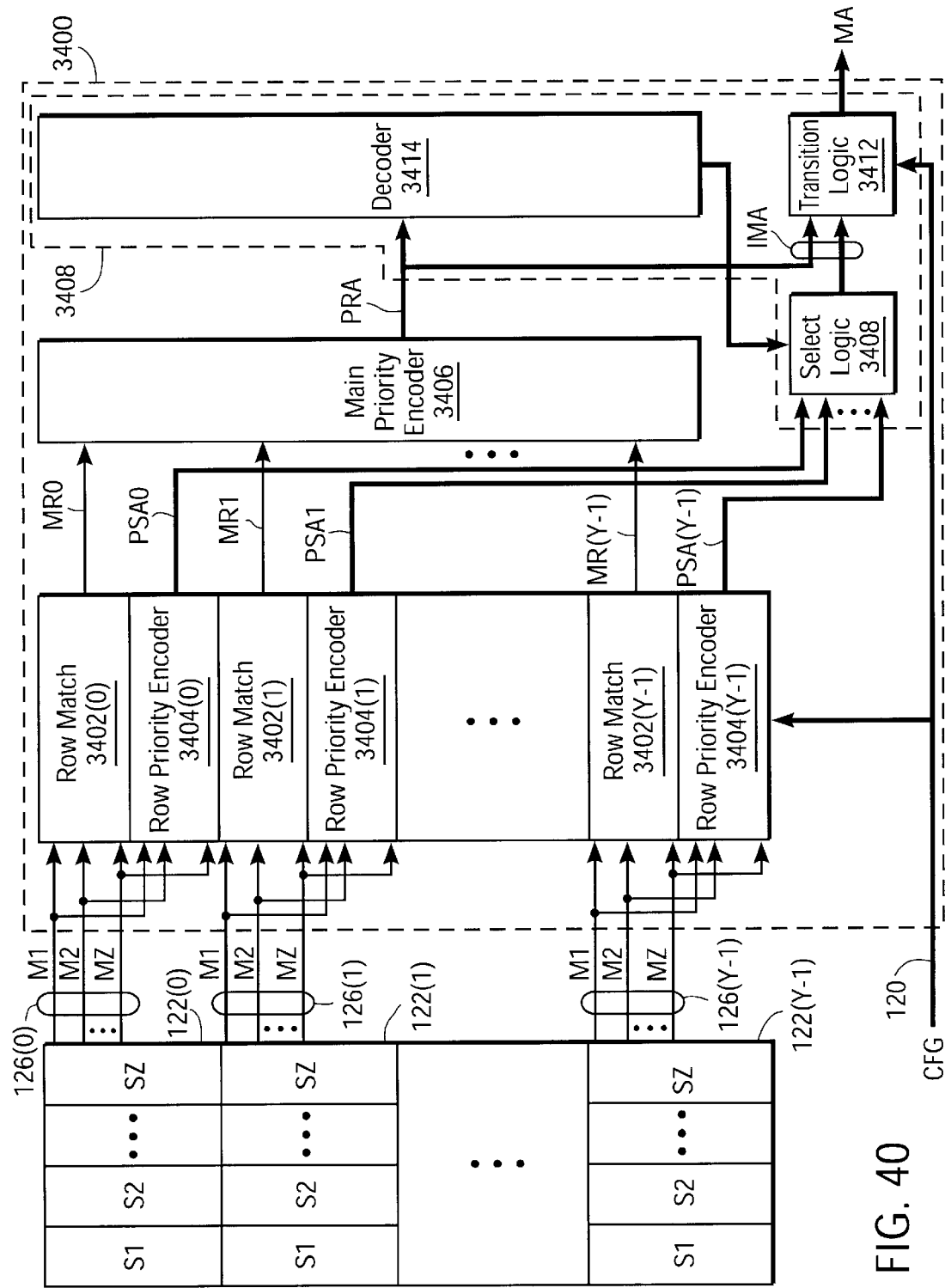
FIG. 40 is a block diagram of the configurable CAM system of FIG. 1 including one embodiment of the select circuitry having a decoder, a multiplexer, and translation logic.

FIG. 40 shows one embodiment of select logic 3408. Other embodiments may be used. For this embodiment, select logic 3408 includes decoder 3414, multiplexer 3410, and translation logic 3412. Decoder 3414 decodes row address PRA and provides the decoded row address as select signals to multiplexer 3410. In response to the decoded row address, multiplexer 3410 selects and outputs one of the segment addresses PSA(0)–PSA(Y-1) associated with the row of CAM cells at row address PRA. The row address and the selected segment address together make up an internal match address IMA. In Y×ZW mode, translation logic 3412 provides IMA as MA. For other configurations, however, not all of the segment address bits are used (e.g., least significant bit SA0(0) in the ×144 bit mode for the example of FIGS. 35–39), or none of the segment address bits are used (e.g., in ZY×W mode where only PRA is used to generate MA) as part of the match address MA. For these configurations, translation logic 3412 translates or shifts the bits of IMA such that the match address starts at its least significant bit. For alternative embodiments, the unused least significant bits of MA may simply be ignored and translation logic 3412 omitted.

Figure 41:
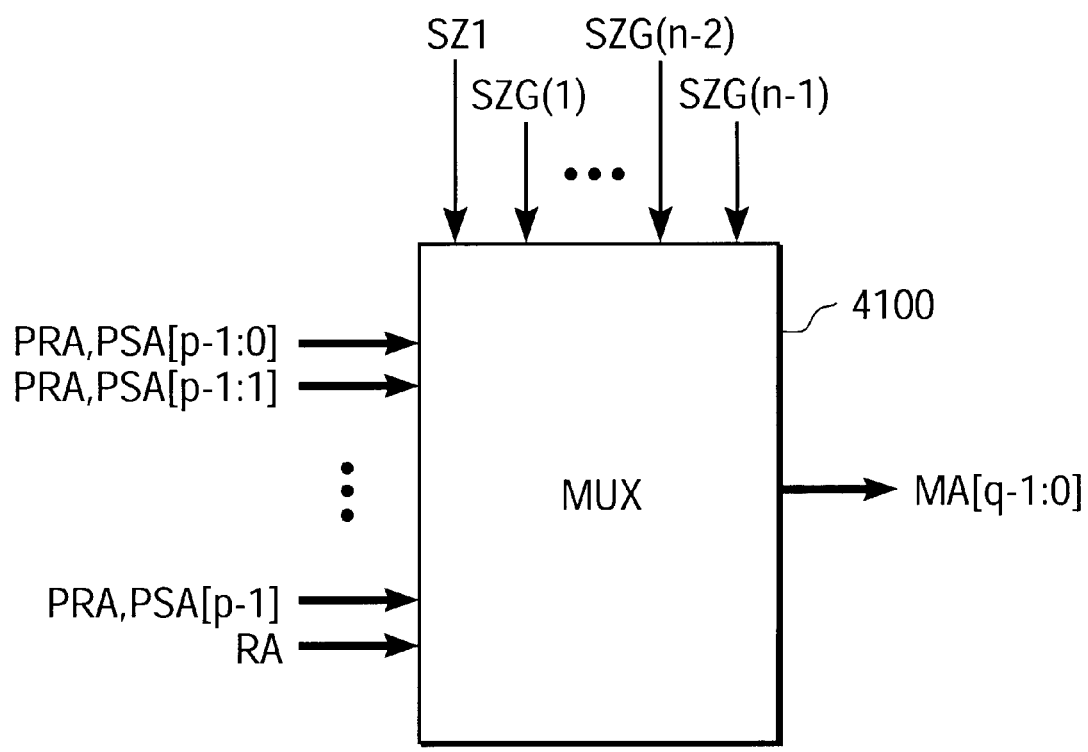
FIG. 41 is a logic diagram of embodiment of the translation logic of FIG. 40.

FIG. 41 shows multiplexer 4100 that is one embodiment of translation logic 3412 of FIG. 40. Multiplexer 4100 receives the configuration signals SZ1 and SZG(1)–SZG(n-1) to select and output one of the PRA/PSA concatenations as the match address. In this embodiment, the match address has q=log$_2$ ZY address bits and multiplexer 4100 outputs one of the PRA/PSA concatenations such that the segment address bits start at the least significant bit of the match address. Any un-used address bits of the match address may be set, for example, to a logic zero state. In the Y×ZW mode, SZ1 is enabled and multiplexer 4100 selects PRA, PSA[p-1:0] to provide as MA[q-1:0], where p=log$_2$ Z. In the ZY/2×2W mode, SZG(1) is enabled and multiplexer 4100 selects PRA, PSA[p-1:1] to provide as MA[q-2:0]. In the ZY/(Z-1)×(Z-1)W mode, SZG(n-1) is enabled and multiplexer 4100 selects PRA, PSA[p-1] to provide as MA[log$_2$ Y:0]. Finally, in the ZY×W mode, multiplexer 4100 provides PRA as MA[log$_2$ Y-1:0]. For another embodiment, multiplexer 4100 may be implemented in AND and OR logic gates such that each configuration signals is logically ANDed with its corresponding PRA/PSA combination, and the outputs of the AND gates provided to OR logic to generate MA.

For another embodiment, translation logic 3412 may be a shift register that receives IMA and then uses the configuration information to indicate the number of times to shift out least significant bits (e.g., divide by 2) from the shift register. For one embodiment, each configuration is associated with a predetermined count value, and the count is decremented for each shift until the count reaches zero. Other embodiments may be used.

Figure 42:
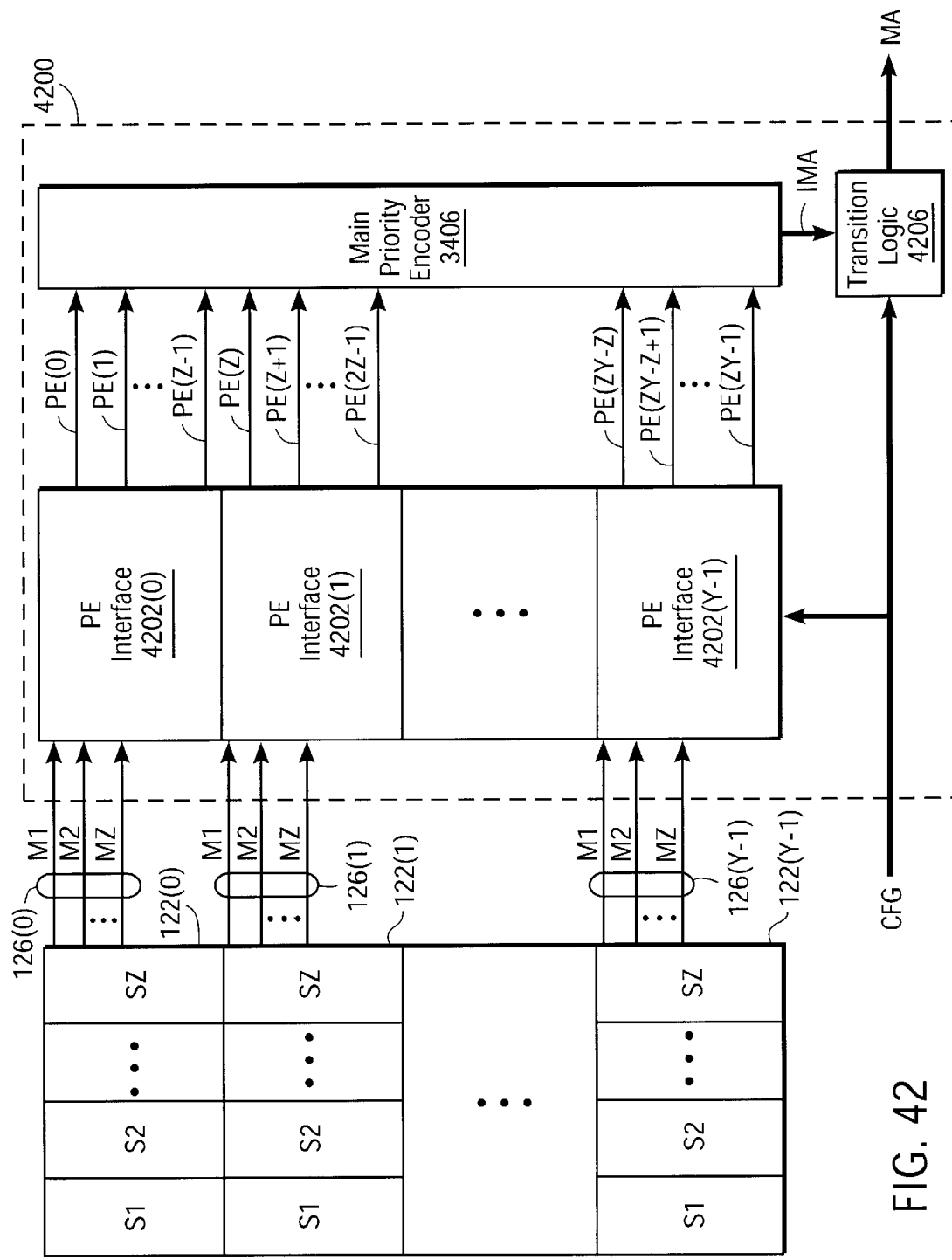
FIG. 42 is a block diagram of the configurable CAM system of FIG. 1 including another embodiment of the priority encoder having priority encoder interface circuits, a priority encoder, and translation logic.

FIG. 42 shows priority encoder logic 4200 that is another embodiment of priority encoder logic 112 of FIG. 1. Priority encoder logic 4200 includes priority encoder (PE) interface circuits 4202(0)–4202(Y-1), priority encoder 4204, and translation logic 4206. Each interface circuit 4202(0)–4202(Y-1) receives the match results from each of the match line segments M1–MZ of a corresponding row of CAM cells and, in response to the configuration information, generates Z priority encoder input signals for priority encoder 4204. The Y interface circuits generate a total of ZY input signals PE(0)–PE(ZY-1). Priority encoder 4204 encodes the ZY priority encoder inputs signals and generates the internal or intermediate match address IMA that has log$_2$ ZY address bits. IMA corresponds to the address of the highest priority row of CAM cells 122 that has a row segment or a group of row segments that stores data that matches the comparand data for a given configuration. In response to the configuration information, translation logic 4206 outputs IMA or a bit translated version of IMA as the match address MA. For alternative embodiments, IMA may be provided as MA and any unused least significant bits of MA may simply be ignored and translation logic 4212 omitted.

Figure 43:
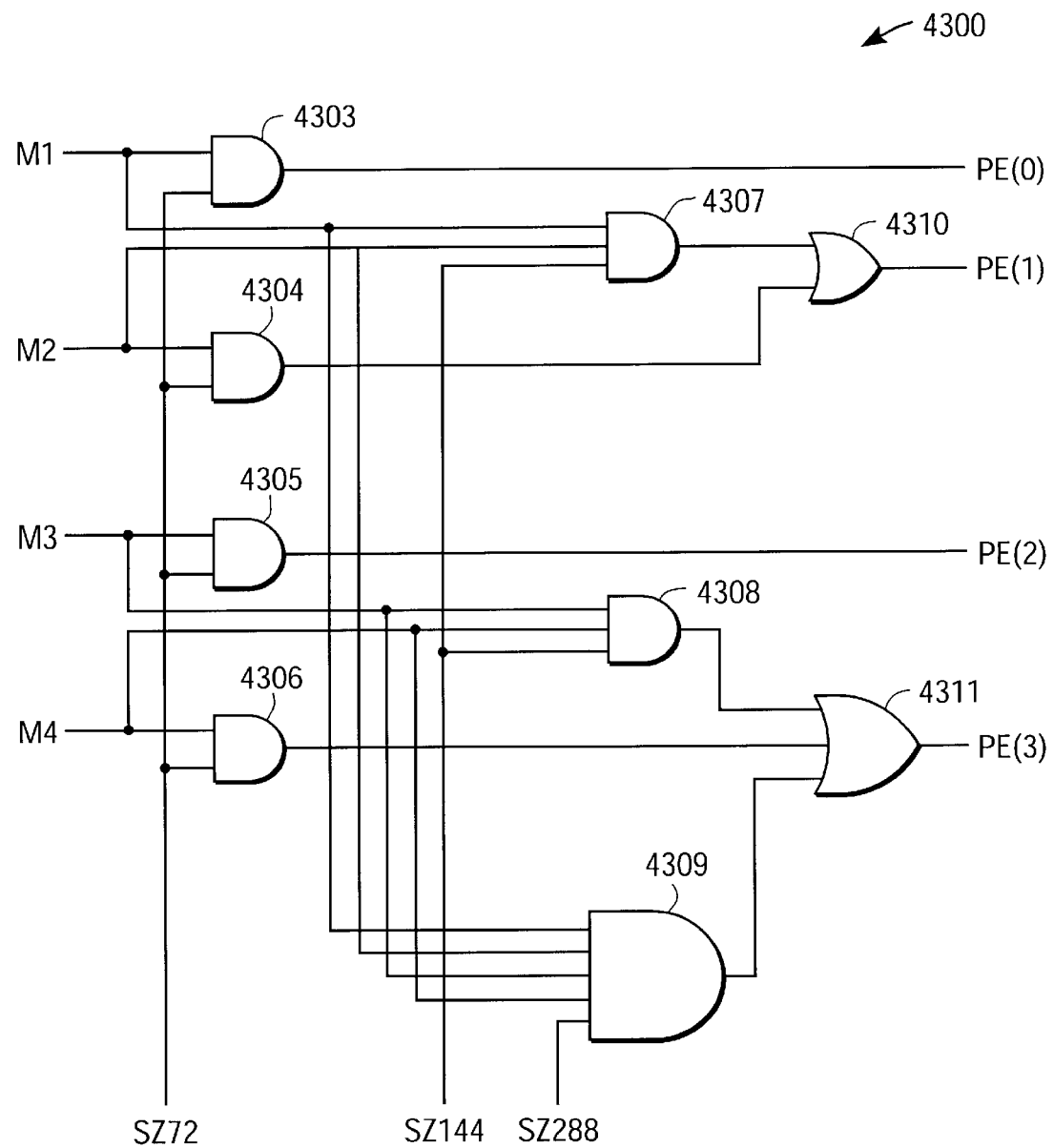
FIG. 43 is a logic diagram of one embodiment of a priority encoder interface circuit of FIG. 42 for particular configurations of the CAM system.

The operation of the priority encoder interface circuits is further illustrated by interface circuit 4300 of FIG. 43. Interface circuit 4300 is one embodiment of interface circuit 4202(0) of FIG. 42 in which array 102 has Y=1024 rows of CAM cells each having Z=4 segments of W=72 CAM cells. Interface circuit 4300 may also be used for all interface circuits. Interface circuit 4300 includes AND gates 4306–4309 and OR gates 4310–4311. AND gates 4303–4306 each receive configuration signal SZ72 and one of M1–M4. AND gate 4303 provides PE(0), and AND gate 4305 provides PE(2). AND gate 4307 receives M1, M2, and configuration signal SZ144. OR gate 4310 provides PE(1) in response to the outputs of AND gates 4307 and 4303. AND gate 4308 receives M3, M4, and configuration signal SZ144. AND gate 4309 receives M1–M4 and configuration signal SZ288. OR gate 4311 provides PE(3) in response to the outputs of AND gates 4306, 4308, and 4309.

In the 4k×72 mode, configuration signal SZ72 is enabled to allow AND gates 4303–4306 and OR gate 4310 and 4311 to provide the logic states on M1–M4 to PE(0)–PE(3), respectively. In this mode all of the 4k individual row segments have unique addresses of zero to 4k-1.

In the 2k×144 mode, configuration signal SZ144 is enabled and the row segments are grouped into addressable pairs S1–S2 and S3–S4. In this mode, configuration signal SZ72 is disabled such that PE(0) and PE(2) are disabled. If the first pair S1–S2 stores data that matches comparand data, then M1 and M2 are enabled and AND gate 4307 and OR gate 4310 enable PE(1). Since S1–S2 is the first addressable group of row segments, it has the address zero in this configuration. However, when PE(1) is enabled, priority encoder 4204 outputs an address of 1 as IMA. Translation logic 4206 translates or shifts the bit positions in IMA by one such that the least significant bit of IMA is dropped and MA reflects an address of 0 rather than 1. Similarly, if the second pair S3–S4 stores data that matches comparand data, then M3 and M are enabled and AND gate 4308 and OR gate 4311 enable PE(3). Since S3–S4 is the second addressable group of row segments, it has the address 1 in this configuration. However, when PE(3) is enabled (and PE(1) is not enabled), priority encoder 4204 outputs an address of 2 as IMA. Translation logic 4206 translates or shifts the bit positions in IMA by one such that the least significant bit of IMA is dropped and MA reflects an address of 1 rather than 2.

Lastly, in the 1k×288 mode, configuration signal SZ288 is enabled and the row segments are all grouped together to form a single addressable row. In this mode, configuration signals SZ72 and SZ144 are disabled such that PE(0)–PE(2) are disabled. If all row segments S1–S4 store data that match 288-bit comparand data, then M1–M4 are enabled and AND gate 4309 and OR gate 4311 enable PE(3). Since group S1–S4 is the first (and only) addressable group of row segments, it has the address 0 in this configuration. However, when PE(3) is enabled, priority encoder 4204 outputs an address of 3 as IMA. Translation logic 4206 translates or shifts the bit positions in IMA by two such that the least significant bit of IMA is dropped and MA reflects an address of 0 rather than 3.

FIG. 44 summarizes the general function of each of the priority encoder interface circuits 4202(0)–4204(Y−1). In configuration ZY×W, SZ1 is enabled and the PE inputs are set the logic states of their corresponding match line segment. In this mode, translation logic 4206 provides IMA as MA. In configuration ZY/2×2W (i.e., n=2), SZG(1) is enabled and every second (nth) PE input is set to the corresponding first group match results. All other PE inputs are set to a mismatch state, and translation logic 4206 translates or shifts the bit positions in IMA by one place such that the least significant bit of IMA is dropped to generate MA. In configuration ZY/4×4W(i.e., n=4), SZG(1) is enabled and every fourth (nth) PE input is set to the corresponding second group match results. All other PE inputs are set to a mismatch state, and translation logic 4206 translates or shifts the bit positions in IMA by two places such that the two least significant bits of IMA are dropped to generate MA This process continues until in configuration Y×ZW (i.e., n=Z), SZG(n−1) is enabled and every Zth (nth) PE input is set to the corresponding row group match results. All other PE inputs are set to a mismatch state, and translation logic 4206 translates or shifts the bit positions in IMA by (Z−1) places such that the (Z−1) least significant bits of IMA are dropped to generate MA. The logic shown in FIG. 43 may be extended to accommodate any number of row segments and any number of configurations. Alternatively, each priority interface circuit may be a multiplexer that uses the configuration signals as select signals to select the match results from the match line segments as shown in FIG. 44.

Figure 45:
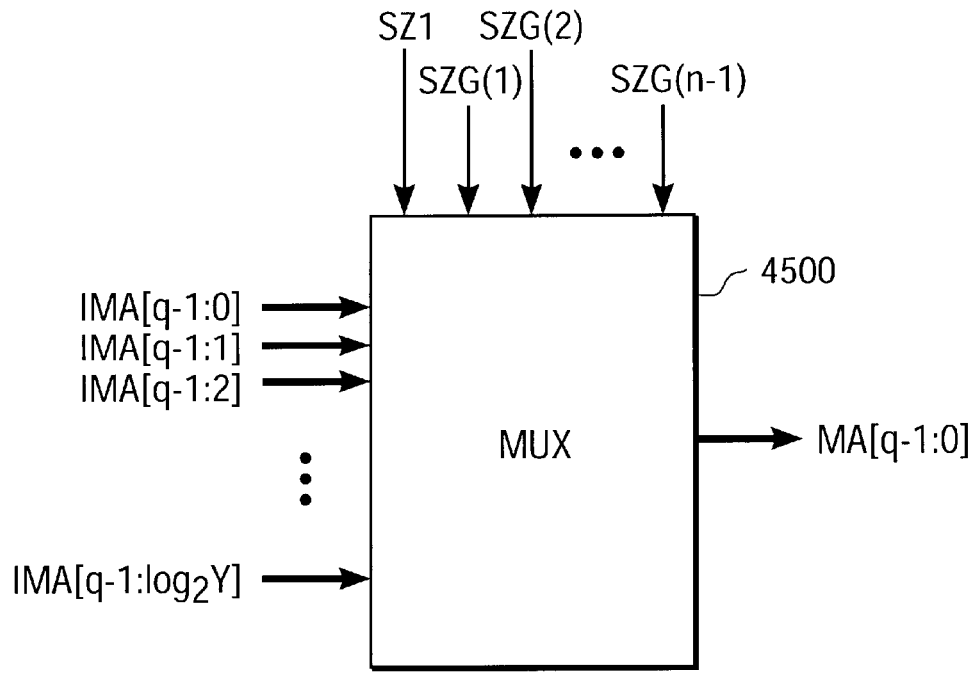
FIG. 45 is a logic diagram of one embodiment of the translation logic of FIG. 42.

FIG. 45 shows multiplexer 4500 that is one embodiment of translation logic 4206 of FIG. 42. Multiplexer 4500 receives the configuration signals SZ1 and SZG(1)–SZG(n−1) to select and output one of the IMA address bit strings as the match address. In this embodiment, the match address has $q=\log_2 ZY$ address bits and multiplexer 4500 outputs one of the IMA bit strings starting at the least significant bit of the match address. Any un-used address bits of the match address may be set to a logic zero state. In the Y×ZW mode, SZ1 is enabled and multiplexer 4500 selects IMA[q-1:0] to provide as MA[q-1:0]. In the ZY/2×2W mode, SZG(1) is enabled and multiplexer 4500 selects IMA[q-1:1] to provide as MA[q-2:0]. In the ZY/4×4W mode, SZG(2) is enabled and multiplexer 4500 selects IMA[q-1:2] to provide as MA[q-3:0]. Finally, in the ZY×W mode, multiplexer 4500 is enabled and multiplexer 4500 selects IMA[q-1:$\log_2$ Y] to provide as MA[$\log_2$ Y-1:0]. For another embodiment, multiplexer 4100 may be implemented in AND and OR logic gates such that each configuration signals is logically ANDed with its corresponding IMA bit string, and the outputs of the AND gates provided to OR logic.

For another embodiment, translation logic 4212 may be a shift register that receives IMA and then uses the configuration information to indicate the number of times to shift out least significant bits (e.g., divide by 2) from the shift register. For one embodiment, each configuration is associated with a predetermined count value, and the count is decremented for each shift until the count reaches zero. Other embodiments may be used.

Figure 46:
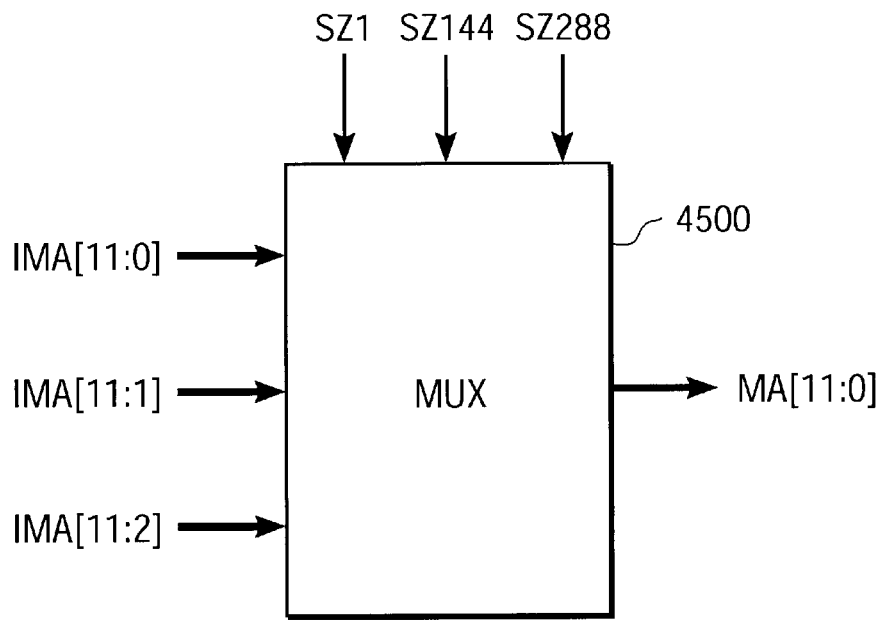
FIG. 46 is a logic diagram of the translation logic of FIG. 45 for a particular configuration of the CAM system.

FIG. 46 shows one embodiment of the multiplexer 4500 configured for the example of FIG. 43. In this embodiment, SZ72 selects IMA[11:0] to be provided as MA[11:0]; SZ144 selects IMA[11:1] to be provided as MA[10:0]; and SZ288 selects IMA[11:2] to provided as MA[9:0]. This embodiment may also be used for translation logic 4100 of FIG. 41.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) system comprising:
   a CAM array having a plurality of rows of CAM cells, each row segmented into a plurality of row segments each having a plurality of CAM cells; and
   means for configuring the CAM array into a plurality of width and depth configurations, wherein the CAM array has Y rows of CAM cells each having Z segments of W CAM cells, where X, Y, and Z are integers greater than or equal to one, and wherein the configuring means comprises means for configuring the CAM array in nW width by ZY/n different depth configurations of the CAM array, where n is an integer from one to Z.

2. The CAM system of claim 1, further comprising a configuration register for storing configuration information indicative of different width and depth configurations of the CAM array.

3. The CAM system of claim 1, further comprising means for uniquely addressing each row segment.

4. The CAM system of claim 1, further comprising:
   means for determining the address of a row segment that stores data matching comparand data when the CAM system is configured in a first width and depth configuration; and
   means for determining the address of a group of row segments that store data matching comparand data when the CAM system is configured in a second width and depth configuration.

5. The CAM system of claim 1, further comprising:
   means for generating a match flag signal when a row segment stores data matching comparand data and the CAM system is configured in a first width and depth configuration; and
   means for generating a match flag signal when a group of row segments store data matching comparand data and the CAM system is configured in a second width and depth configuration.

6. The CAM system of claim 1, further comprising:
   means for generating a multiple match flag signal when each of a plurality of row segments store data matching comparand data and the CAM system is configured in a first width and depth configuration; and means for generating a multiple match flag signal when each of a plurality of groups of row segments store data matching comparand data and the CAM system is configured in a second width and depth configuration.

7. A content addressable memory (CAM) system comprising:
- a CAM array having a plurality of rows of CAM cells, each row segmented into a plurality of row segments each having a plurality of CAM cells coupled to a corresponding match line segment;
- address logic coupled to the CAM array to uniquely address individual row segments and groups of row segments according to configuration information capable of indicating a plurality of width and depth configurations of the CAM array; and
- priority encoding circuitry coupled to the match line segments and having inputs to receive the configuration information.

8. The CAM system of claim 7, wherein the priority encoding circuitry is operable to generate the address of a row segment that stores data matching comparand data in response to the configuration information.

9. The CAM system of claim 7, further comprising match flag logic coupled to the match line segments to determine (i) when comparand data matches data stored in one of the row segments when the configuration information indicates a first width and depth configuration of the CAM array, and (ii) when comparand data matches data stored in a group of the row segments when the configuration information indicates a second width and depth configuration of the CAM array.

10. The CAM system of claim 7, further comprising multiple match flag logic coupled to the match line segments to determine (i) when comparand data matches data stored in each of a plurality of row segments when the configuration information indicates a first width and depth configuration of the CAM array, and (ii) when comparand data matches data stored in each of a plurality of groups of row segments when the configuration information indicates a second width and depth configuration of the CAM array.

11. A content addressable memory (CAM) system comprising:
- a CAM array having a plurality of rows of CAM cells, each row segmented into a plurality of row segments each having a plurality of CAM cells coupled to a corresponding match line segment;
- address logic coupled to the CAM array to uniquely address individual row segments and groups of row segments in response to configuration information, wherein the configuration information is indicative of a width and depth configuration of the CAM array;
- data access circuitry coupled to the address logic and the CAM array to communicate data with the row segment; and
- priority encoding circuitry coupled to the match line segments and having inputs to receive the configuration information.

12. The CAM system of claim 1, further comprising a configuration register to store the configuration information.

13. The CAM system of claim 1, wherein the priority encoding circuitry is operable to generate the address of a row segment that stores data matching comparand data in response to the configuration information.

14. The CAM system of claim 1, further comprising match flag logic coupled to the match line segments to determine when comparand data matches data stored in one of the row segments in response to the configuration information.

15. The CAM system of claim 1, further comprising multiple match flag logic coupled to the match line segments to determine when comparand data matches data stored in each of a plurality of row segments in response to first configuration information, and to determine when comparand data matches data stored in each of a plurality of groups of row segments in response to second configuration information.

16. The CAM system of claim 1, further comprising an instruction decoder coupled to the address logic and access circuitry, the instruction decoder to receive an instruction for the CAM system.

17. A method of configuring a content addressable memory (CAM) system into a plurality of width and depth configurations, comprising:
- segmenting each row of CAM cells into a plurality of individually addressable row segments each having a plurality of CAM cells coupled to a corresponding match line segment;
- receiving configuration information indicative of at least one width and depth configurations of the CAM array;
- uniquely and successively addressing a plurality of individual row segments in a row of CAM cells in response to first configuration information indicative of a first width and depth configuration of the CAM array;
- writing data to each of the row segments;
- comparing first comparand data with the data stored in each of the row segments; and
- determining the address of one of the row segment that stores data matching the comparand data in response to the first configuration information.

18. The method of 17, further comprising generating a match flag signal when at least one of the row segments stores data matching comparand data.

19. The method of claim 17, further comprising generating a multiple match flag signal when two or more of the plurality of row segments each store data matching comparand data.

20. A method of configuring a content addressable memory (CAM) system into a plurality of width and depth configurations, comprising:
- segmenting each row of CAM cells into a plurality of individually addressable row segments each having a plurality of CAM cells coupled to a corresponding match line segment;
- receiving configuration information indicative of at least one width and depth configurations of the CAM array;
- uniquely and successively addressing a plurality of groups of row segments in response to first configuration information indicative of a first width and depth configuration of the CAM array;
- writing data to each of the groups of row segments;
- comparing second comparand data with the data stored in each of the groups of row segments; and
- determining the address of one of the groups of row segments that stores data matching the comparand data in response to the first configuration information.

21. The method of claim 20, further comprising generating a match flag signal when at least one of the groups of row segment stores data matching the first comparand data.

22. The method of claim 20, further comprising generating a multiple match flag signal when two or more of the groups of row segments each store data matching the first comparand data.

* * * * *